US011567156B2

(12) United States Patent
Hu et al.

(10) Patent No.: US 11,567,156 B2
(45) Date of Patent: Jan. 31, 2023

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Lingzhi Hu, Houston, TX (US); Yiran Li, Houston, TX (US); Xinyuan Xia, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 0 days.

(21) Appl. No.: 17/348,735

(22) Filed: Jun. 15, 2021

(65) Prior Publication Data
US 2021/0311152 A1 Oct. 7, 2021

Related U.S. Application Data

(63) Continuation-in-part of application No. 16/455,869, filed on Jun. 28, 2019.

(30) Foreign Application Priority Data

May 8, 2019 (CN) .......................... 201910378793.3

(51) Int. Cl.
*G01V 3/00* (2006.01)
*G01R 33/565* (2006.01)
(Continued)

(52) U.S. Cl.
CPC ... *G01R 33/56509* (2013.01); *G01R 33/4826* (2013.01); *G01R 33/5608* (2013.01); *G01R 33/5611* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 10,716,515 B2 7/2020 Gustafsson et al.
2004/0010210 A1 1/2004 Avinash et al.
(Continued)

FOREIGN PATENT DOCUMENTS

CN 103315739 A 9/2013
CN 103584919 A 2/2014
(Continued)

OTHER PUBLICATIONS

F. Thiel et al., Combining Magnetic Resonance Imaging and Ultrawideband Radar: A New Concept for Multimodal Biomedical Imaging, Review of Scientific Instruments, 80(1): 014302-1-014302-10, 2009.
(Continued)

*Primary Examiner* — Walter L Lindsay, Jr.
*Assistant Examiner* — Frederick Wenderoth
(74) *Attorney, Agent, or Firm* — Metis IP LLC

(57) ABSTRACT

A method for magnetic resonance imaging (MRI) is provided. The method may include obtaining scan data of a subject. The scan data may be acquired by an MR scanner at a time according to a pulse sequence. The method may include obtaining motion data of the subject. The motion data of the subject may be acquired by one or more sensors at the time. The motion data may reflect a motion state of the subject at the time. The method may also include determining, based on the motion data of the subject, a processing strategy indicating whether using the scan data to fill one or more k-space lines corresponding to the pulse sequence in a
(Continued)

k-space. The method may further include obtaining k-space data based on the processing strategy.

17 Claims, 13 Drawing Sheets

(51) Int. Cl.
    *G01R 33/48*      (2006.01)
    *G01R 33/561*      (2006.01)
    *G01R 33/56*      (2006.01)

(58) Field of Classification Search
    USPC .......................................................... 324/309
    See application file for complete search history.

(56) References Cited

U.S. PATENT DOCUMENTS

| | | |
|---|---|---|
| 2009/0192384 A1 | 7/2009 | Fontius |
| 2009/0245457 A1 | 10/2009 | Takeuchi et al. |
| 2010/0290683 A1 | 11/2010 | Demeester et al. |
| 2012/0169333 A1 | 7/2012 | Katscher et al. |
| 2013/0251225 A1* | 9/2013 | Liu .................... G01R 33/5673 382/131 |
| 2015/0366527 A1 | 12/2015 | Yu et al. |
| 2018/0098739 A1 | 4/2018 | Freeman et al. |
| 2018/0368721 A1 | 12/2018 | Ahn |
| 2020/0234434 A1 | 7/2020 | Yu et al. |
| 2020/0352524 A1 | 11/2020 | Hu et al. |
| 2021/0059628 A1 | 3/2021 | Yang et al. |

FOREIGN PATENT DOCUMENTS

| | | | | |
|---|---|---|---|---|
| CN | 103892813 A | | 7/2014 | |
| CN | 104569963 A | * | 4/2015 | ............. G01S 13/70 |
| CN | 106251380 A | | 12/2016 | |
| CN | 106462232 A | * | 2/2017 | ........... G02B 27/017 |
| CN | 106569159 A | * | 4/2017 | ............. G01R 33/54 |
| CN | 109199346 A | | 1/2019 | |
| CN | 109363702 A | | 2/2019 | |
| JP | 5942244 B2 | * | 6/2016 | |
| WO | WO-2010069168 A1 | * | 6/2010 | ............. G06T 7/248 |

OTHER PUBLICATIONS

Stefano Pisa et al., A Survey of Radar Systems for Medical Applications, IEEE Aerospace and Electronic Systems Magazine, 31(11): 64-81, 2016.

F. Thiel et al., Non-contact Detection of Myocardium's Mechanical Activity by Ultrawideband RF-radar and Interpretation Applying Electrocardiography, Review of Scientific Instruments, 80(11): 114302-1-114302-12, 2009.

* cited by examiner

SYSTEMS AND METHODS FOR MAGNETIC RESONANCE IMAGING

CROSS-REFERENCE OF RELATED APPLICATION

This application is a Continuation-in-part of U.S. application Ser. No. 16/455,869, filed on Jun. 28, 2019, which claims priority of Chinese Patent Application No. 201910378793.3, filed on May 8, 2019, the contents of which are hereby incorporated by reference.

TECHNICAL FIELD

The present disclosure generally relates to magnetic resonance imaging, and more particularly, relates to systems and methods for processing scan data acquired in magnetic resonance imaging.

BACKGROUND

Imaging is widely used in a variety of medical treatments and/or diagnostics. Various imaging devices (e.g., a computed tomography (CT) device, a magnetic resonance imaging (MR) device, or a positron emission tomography (PET) device) can be used to perform imaging by scanning a subject (e.g., a patient). A motion of the subject during the scan, such as a cardiac motion, a respiratory motion, an irregular motion of portions of the body (e.g., the head, a leg, etc.), etc., may cause motion artifacts. For example, during an MRI scan, if the patient moves his or her head, a final reconstructed image may include motion artifacts and/or become blurry. In this case, a diagnosis and/or treatment of a disease based on the reconstructed image including the motion artifacts may be unreliable due to poor image quality. Therefore, it is desirable to develop systems or methods to control an imaging device to reduce or avoid motion artifacts in imaging.

SUMMARY

According to a first aspect of the present disclosure, a system for magnetic resonance imaging (MRI) is provided. The system may include at least one storage device and at least one processor. The at least one storage device may include a set of instructions. The at least one processor may be configured to communicate with the at least one storage device. When executing the set of instructions, the at least one processor may be configured to direct the system to perform operations. The operations may include obtaining scan data of a subject. The scan data may be acquired by an MR scanner at a time according to a pulse sequence. The operations may include obtaining motion data of the subject. The motion data of the subject may be acquired by one or more sensors at the time. The motion data may reflect a motion state of the subject at the time. The operations may also include determining, based on the motion data of the subject, a processing strategy indicating whether using the scan data to fill one or more k-space lines corresponding to the pulse sequence in a k-space. The operations may further include obtaining k-space data based on the processing strategy.

According to a second aspect of the present disclosure, a system for magnetic resonance imaging (MRI) is provided. The system may include at least one storage device and at least one processor. The at least one storage device may include a set of instructions. The at least one processor may be configured to communicate with the at least one storage device. When executing the set of instructions, the at least one processor may be configured to direct the system to perform operations. The operations may include obtaining first scan data of a subject. The first scan data may be acquired by an MR scanner at a first time according to a first pulse sequence. The operations may include obtaining first motion data of the subject. The first motion data of the subject may be acquired by one or more sensors at the first time. The first motion data may reflect a first motion state of the subject at the first time. The operations may also include determining, based on the first motion data, whether the first motion state satisfies a first condition. The operations may further include determining k-space data based on whether the first motion state satisfies the first condition. In response to determining that the first motion state satisfies the first condition, the operations may include determining, based on the first scan data, the k-space data. In response to determining that the first motion state does not satisfy the first condition, the operations may include obtaining second scan data of the subject. The second scan data may be acquired by the MR scanner at a second time according to a second pulse sequence. The operations may include obtaining second motion data of the subject. The second motion data may be acquired by the one or more sensors at the second time according to the second pulse sequence. The second motion data may reflect a second motion state of the subject at the second time. The operations further may include determining the k-space data based on the second scan data and the second motion data.

According to a third aspect of the present disclosure, a system for magnetic resonance imaging (MRI) is provided. The system may include at least one storage device and at least one processor. The at least one storage device may include a set of instructions. The at least one processor may be configured to communicate with the at least one storage device. When executing the set of instructions, the at least one processor may be configured to direct the system to perform operations. The operations may include obtaining first scan data of a subject. The first scan data may be acquired by an MR scanner at a first time period according to a first pulse sequence. The operations may include obtaining first motion data of the subject, the first motion data of the subject being acquired by one or more sensors at the first time. The first motion data may reflect a first motion state of the subject at the first time. The operations may include obtaining second scan data of the subject. The second scan data may be acquired by the MR scanner at a second time period according to a second pulse sequence. The operations may also include obtaining second motion data of the subject. The second motion data of the subject may be acquired by one or more sensors at the second time. The second motion data may reflect a second motion state of the subject at the second time. The operations may include determining, based on the first motion data and the second motion data, each of a first processing strategy of the first scan data and a second processing strategy of the second scan data. The operations may further include obtaining k-space data based on the first processing strategy and the second processing strategy.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein.

DETAILED DESCRIPTION

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "engine," "unit," "module," and/or "block" used herein are one method to distinguish different components, elements, parts, sections, or assembly of different levels in ascending order. However, the terms may be displaced by another expression if they achieve the same purpose.

Figure 2:
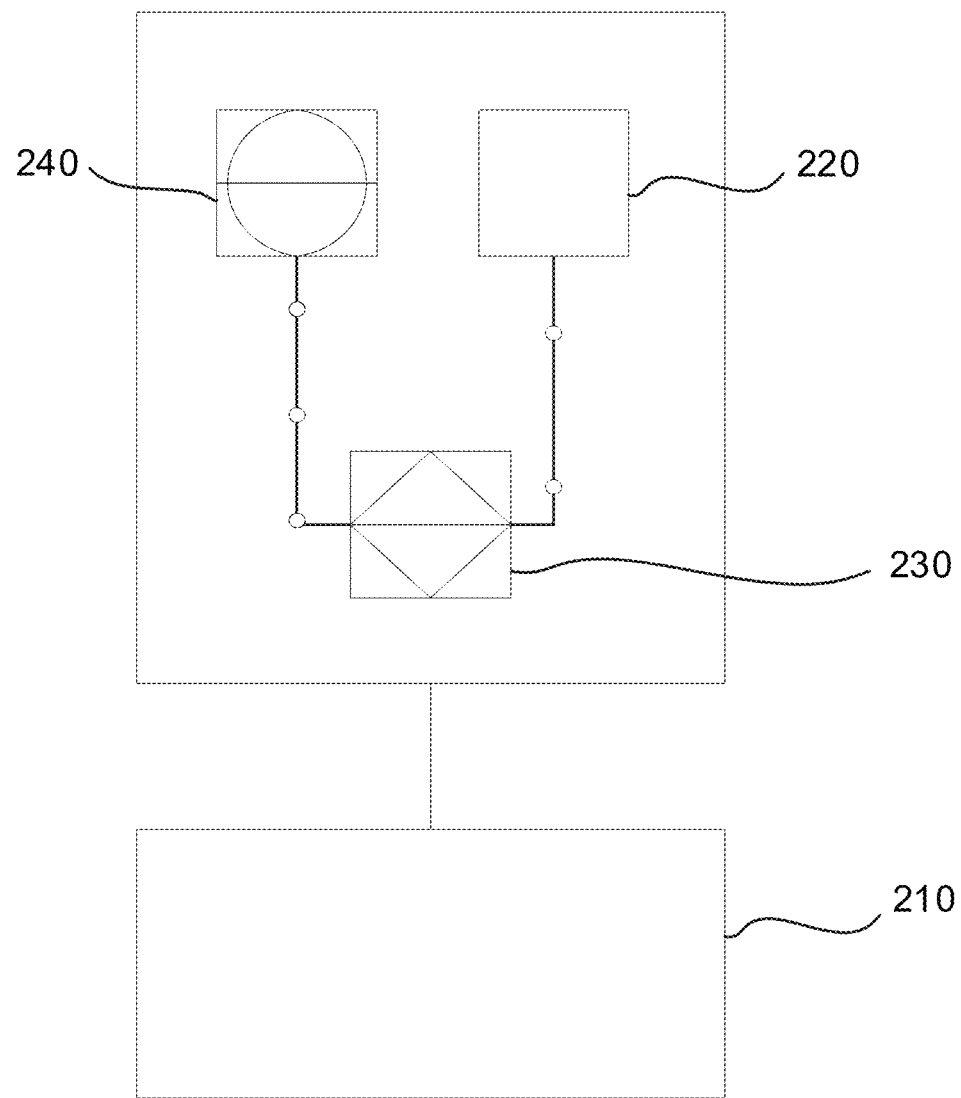
FIG. 2 is a schematic diagram illustrating an exemplary medical device according to some embodiments of the present disclosure.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage devices. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices (e.g., processing device 240 as illustrated in FIG. 2) may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

For illustration purposes, the following description is provided to help better understanding an imaging process. It is understood that this is not intended to limit the scope of the present disclosure. For persons having ordinary skills in the art, a certain amount of variations, changes, and/or modifications may be deducted under the guidance of the present disclosure. Those variations, changes, and/or modifications do not depart from the scope of the present disclosure.

Provided herein are systems and components for medical imaging and/or medical treatment. In some embodiments, the medical system may include one or more modalities including Digital Subtraction Angiography (DSA), Magnetic Resonance Imaging (MRI), Magnetic Resonance Angiography (MRA), Computed tomography (CT), Computed Tomography Angiography (CTA), Ultrasound Scanning (US), Positron Emission Tomography (PET), Single-Photon Emission Computerized Tomography (SPECT), CT-MR, CT-PET, CE-SPECT, DSA-MR, PET-MR, PET-US, SPECT-US, TMS (transcranial magnetic stimulation)-MR, US-CT, US-MR, X-ray-CT, X-ray-MR, X-ray-portal, X-ray-US, Video-CT, Vide-US, or the like, or any combination thereof.

An aspect of the present disclosure relates to systems and methods for controlling a medical device. The medical device may include a medical imaging device, e.g., an MRI device. In some embodiments, the system may include one or more sensors, such as one or more radars, one or more cameras, etc. The medical device may be controlled by fusing data acquired by the one or more radars and the one or more cameras. For example, the system may determine first data regarding a first motion of a subject by processing a plurality of image frames acquired by the one or more cameras. The system may determine second data regarding second data regarding a second motion of the subject by processing radar echo data acquired by the one or more radars. The radar echo data may be corrected based on the first data. In some embodiments, the first motion may include a rigid motion of the subject, and the second motion may include a physiological motion. The system may extract physiological motion information based on the first data and the second data. For example, the physiological motion information may include cardiac motion data and/or respiratory motion data. The system may control, based on the motion information (e.g., the physiological motion), the medical device in order to reduce or avoid the effect of motion artifacts in, e.g., imaging, delivery of a treatment dosage (e.g., a radiation beam toward a target region).

Another aspect of the present disclosure relates to systems and methods for k-space data determination. The system may obtain scan data of a subject. The system may obtain motion data of the subject. The scan data may be acquired by an MR scanner at a time according to a pulse sequence. The motion data of the subject may be acquired by one or more sensors at the time. In other words, the scan data and the motion data may be acquired simultaneously by the MR scanner and the one or more sensors, respectively. The motion data may reflect a motion state of the subject at the time. The system may determine, based on the motion data of the subject, a processing strategy indicating whether using the scan data to fill one or more k-space lines corresponding to the pulse sequence in a k-space. The system may obtain k-space data based on the processing strategy. The system may determine, based on the motion information (e.g., the irregular motion or the rigid motion), the processing strategy for the scan data acquired by the MR scanner at each time. The processing strategy may indicate whether using the scan data to fill a k-space and how to process (e.g., correction, update or replacement, etc.) the scan data for filling the k-space, such that scan data acquired when the subject moves or moves significantly may be not used to fill a k-space, thereby reducing or avoiding the effect of motion artifacts in, e.g., imaging, delivery of a treatment dosage (e.g., a radiation beam toward a target region).

The following description is provided with reference to exemplary embodiments that the medical device includes an imaging device (e.g., a scanner) unless otherwise stated. However, it is understood that it is for illustration purposes only and not intended to limit the scope of the present disclosure. The system and method disclosed herein may be suitable for other applications. Merely by way of example, the medical device may include a radiotherapy device (an image guided radiotherapy (IGRT) device); the system and method for identifying a physiological motion and/or rigid motion may be used in controlling imaging and/or the delivery of a radiation beam in radiotherapy.

Figure 1:
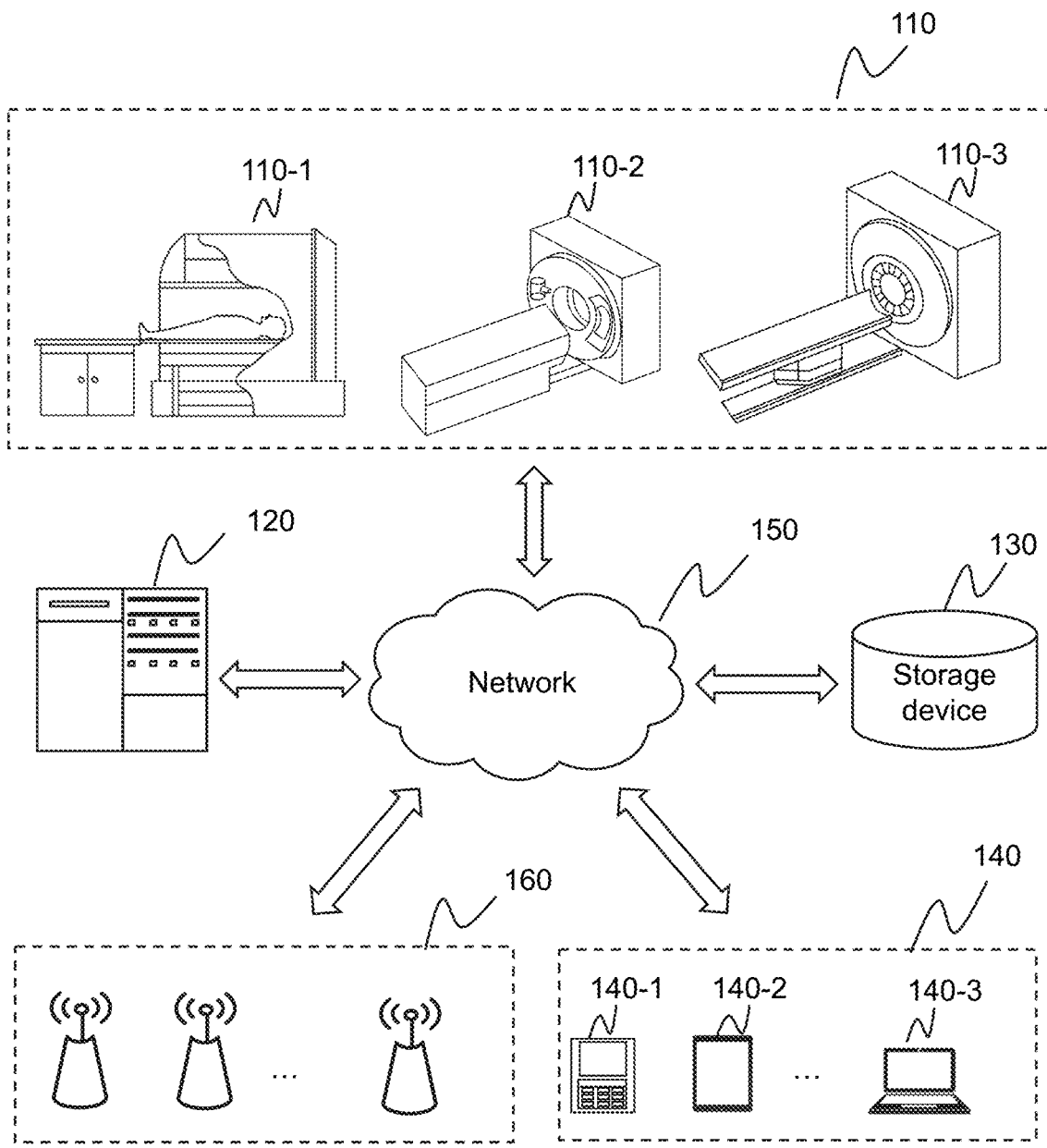
FIG. 1 is a schematic diagram illustrating an exemplary medical system according to some embodiments of the present disclosure.

FIG. 1 is a schematic diagram illustrating an exemplary medical system according to some embodiments of the present disclosure. As shown in FIG. 1, medical system 100 may include a medical device 110, a processing device 120, a storage device 130, one or more terminals 140, a network 150, and one or more sensors 160. The components in the medical system 100 may be connected in one or more of various ways. Merely by way of example, as illustrated in FIG. 1, the medical device 110 may be connected to the processing device 120 through the network 150. As another example, the medical device 110 may be connected to the processing device 120 directly as indicated by the bi-directional arrow in dotted lines linking the medical device 110 and the processing device 120. As a further example, the storage device 130 may be connected to the processing device 120 directly or through the network 150. As still a further example, one or more terminals 140 may be connected to the processing device 120 directly or through the network 150 (as indicated by the bi-directional arrow in a solid line linking the terminal 140 and the processing device 120). As still a further example, one or more sensors 160 may be connected to the processing device 120 directly or through the network 150 (as indicated by the bi-directional arrow in a solid line linking the sensors 160 and the processing device 120).

The medical device 110 may generate or provide image data by scanning a subject or at least a part of the subject. In some embodiments, the medical device 110 may be a medical imaging device, for example, a positron emission tomography (PET) device, a single photon emission computed tomography (SPECT) device, a computed tomography CT device, a magnetic resonance imaging (MRI) device, a radiation therapy (RT) device, or the like, or any combination thereof. In some embodiments, the medical device 110 may include a single-modality scanner. The single-modality scanner may include, for example, a magnetic resonance (MR) scanner 110-1, a computed tomography (CT) scanner 110-2, and/or a positron emission tomography (PET) scanner 110-3. In some embodiments, the medical device 110 may include both the CT scanner 110-2 and the PET scanner 110-3. In some embodiments, image data of different modalities related to the subject, such as CT image data and PET image data, may be acquired using different scanners separately. In some embodiments, the medical device 110 may include a multi-modality scanner. The multi-modality scanner may include a positron emission tomography-computed tomography (PET-CT) scanner, a positron emission tomography-magnetic resonance imaging (PET-MRI) scanner, or the like, or any combination thereof. The multi-modality scanner may perform multi-modality imaging simultaneously. For example, the PET-CT scanner may generate structural X-ray CT image data and functional PET image data simultaneously in a single scan. The PET-MRI scanner may generate MRI data and PET data simultaneously in a single scan. In some embodiments, the medical device 110 may include an image-guided radiotherapy (IGRT) device (not shown in FIG. 1). For example, the IGRT device may include a positron emission tomography-radiotherapy (PET-RT) device, or a magnetic resonance imaging-radiotherapy (MRI-RT) device, etc.

Merely by way of example, the medical device 110 may be the MR scanner 110-1. The MR scanner 110-1 may be configured to scan a subject (or a part of the subject) to acquire scan data, such as MR signals associated with the subject. For example, the MR scanner 110-1 may detect a plurality of MR signals by applying an MR sequence on the subject. In some embodiments, the MR scanner 110-1 may include, for example, a magnetic body, a gradient coil assembly, an RF coil assembly, etc. In some embodiments, the MRI scanner 110-1 may be a permanent magnet MR scanner, a superconducting electromagnet MR scanner, or a resistive electromagnet MR scanner, etc., according to types of the magnetic body. In some embodiments, the MR scanner 110-1 may be a high-field MR scanner, a mid-field MR scanner, and a low-field MR scanner, etc., according to the intensity of the magnetic field.

The magnetic body may generate a first magnetic field (also referred to as a main magnetic field) for polarizing the subject to be scanned. The magnetic body may include a permanent magnet, a superconducting electromagnet, a resistive electromagnet, etc. The gradient coil assembly may generate a second magnetic field (also referred to as a gradient magnetic field). The gradient coil assembly may include X-gradient coils, Y-gradient coils, and Z-gradient coils. The gradient coil assembly may generate one or more magnetic field gradient pulses to the main magnetic field in the X direction (Gx), the Y direction (Gy), and the Z direction (Gz) to encode the spatial information of the subject. In some embodiments, the X direction may be designated as a frequency encoding direction, while the Y direction may be designated as a phase encoding direction. In some embodiments, Gx may be used for frequency encoding or signal readout, generally referred to as frequency encoding gradient or readout gradient. In some embodiments, Gy may be used for phase encoding, generally referred to as phase encoding gradient. In some embodiments, Gz may be used for slice selection for obtaining 2D k-space data. In some embodiments, Gz may be used for phase encoding for obtaining 3D k-space data. The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, one or more MR signals relating to the subject may be generated according to a pulse sequence. The RF receiver coils may acquire MR signals from the subject according to the pulse sequence. The pulse sequence may be defined by imaging parameters and arrangements associated with the image parameters in the time sequence. For example, the pulse sequence may be defined by one or more parameters relating to time, such as a repetition time (TR), an acquisition time (TA), an echo time (TE), etc. The MR signals may also be referred to as echo signals. The MR signals may be processed using a transform operation (e.g., Fourier Transform) to fill a k-space to obtain the k-space data. Each of the MR signals may be generated under a phase encoding gradient that is defined by the pulse sequence. The phase encoding gradient may correspond to a k-space line and an MR signal generated under the phase encoding gradient may be used to fill the k-space line in the k-space corresponding to the phase encoding gradient (or the pulse sequence). Different k-space lines in the k-space may correspond to different phase encoding gradients.

In some embodiments, two or more consecutive MR signals acquired in a scanning may be obtained for performing one single pulse sequence. The one single pulse sequence may define two or more phase encoding gradients.

In some embodiments, the subject may include a body, a substance, or the like, or any combination thereof. In some embodiments, the subject may include a specific portion of a body, such as a head, a thorax, an abdomen, or the like, or any combination thereof. In some embodiments, the subject may include a specific organ, such as an esophagus, a trachea, a bronchus, a stomach, a gallbladder, a small intestine, a colon, a bladder, a ureter, a uterus, a fallopian tube, etc. In some embodiments, the subject may include a physical model (e.g., a water phantom). In the present disclosure, "object" and "subject" are used interchangeably. In some embodiments, the medical device 110 may include a scanning table. The subject may be placed on the scanning table for imaging.

In some embodiments, the medical device 110 may transmit the image data via the network 150 to the processing device 120, the storage device 130, the terminal(s) 140, and/or the one or more sensors 160. For example, the image data may be sent to the processing device 120 for further processing or may be stored in the storage device 130. In some embodiments, the medical device 110 may be configured to scan the subject or at least a part of the subject in response to a control signal generated by the processing device 120.

The processing device 120 may process data and/or information obtained from the medical device 110, the storage device 130, the terminal(s) 140, and/or the one or more sensors 160. For example, the processing device 120 may obtain first data regarding a first motion of the subject through one or more cameras disposed in the medical device 110. The processing device 120 may obtain second data regarding a second motion of the subject through one or more radars disposed in the medical device 110. The processing device 120 may generate a control signal based on the first data and the second data. As another example, the processing device 120 may generate an image (e.g., an MR image) by reconstructing scan data acquired by the medical device 110 (e.g., an MRI device). As yet another example, the processing device 120 may obtain scan data of a subject. The scan data may be acquired by an MR scanner at a time according to a pulse sequence. The processing device 120 may obtain motion data of the subject. The motion data of the subject may be acquired by one or more sensors at the time. The motion data may reflect a motion state of the subject at the time. The processing device 120 may determine, based on the motion data of the subject, a processing strategy indicating whether using the scan data to fill one or more k-space lines corresponding to the pulse sequence in a k-space. The processing device 120 may obtain k-space data based on the processing strategy.

In some embodiments, the processing device 120 may be a single server or a server group. The server group may be centralized or distributed. In some embodiments, the processing device 120 may be local or remote. For example, the processing device 120 may access information and/or data from the medical device 110, the storage device 130, the terminal(s) 140, and/or the one or more sensors 160 via the network 150. As another example, the processing device 120 may be directly connected to the medical device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof.

The storage device 130 may store data, instructions, and/or any other information. In some embodiments, the storage device 130 may store data obtained from the medical device 110, the processing device 120, the terminal(s) 140, and/or the one or more sensors 160. In some embodiments, the storage device 130 may store data and/or instructions that the processing device 120 may execute or use to perform exemplary methods described in the present disclosure. In some embodiments, the storage device 130 may include a mass storage device, a removable storage device, a volatile read-and-write memory, a read-only memory (ROM), or the like, or any combination thereof. In some embodiments, the storage device 130 may be implemented on a cloud platform as described elsewhere in the disclosure. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the medical system 100 (e.g., the processing device 120, the terminal(s) 140, the one or more sensors 160, etc.). One or more components in the medical system 100 may access the data or instructions stored in the storage device 130 via the network 150. In some embodiments, the storage device 130 may be part of the processing device 120.

The terminal(s) 140 may be connected to and/or communicate with the medical device 110, the processing device 120, and/or the storage device 130. For example, the terminal(s) 140 may obtain a processed image from the processing device 120. As another example, the terminal(s) 140 may obtain scan data acquired by the medical device 110 and transmit the scan data to the processing device 120 to be processed. In some embodiments, the terminal(s) 140 may include a mobile device 140-1, a tablet computer 140-2, a laptop computer 140-3, or the like, or any combination thereof. For example, the mobile device 140-1 may include a mobile phone, a personal digital assistance (PDA), a gaming device, a navigation device, a point of sale (POS) device, a laptop, a tablet computer, a desktop, or the like, or any combination thereof. In some embodiments, the terminal(s) 140 may include an input device, an output device, etc. The input device may include alphanumeric and other keys that may be input via a keyboard, a touch screen (for example, with haptics or tactile feedback), a speech input, an eye tracking input, a brain monitoring system, or any other comparable input mechanism. The input information received through the input device may be transmitted to the processing device 120 via, for example, a bus, for further processing. Other types of the input device may include a cursor control device, such as a mouse, a trackball, or cursor direction keys, etc. The output device may include a display, a speaker, a printer, or the like, or a combination thereof. In some embodiments, the terminal(s) 140 may be part of the processing device 120.

The network 150 may include any suitable network that can facilitate exchange of information and/or data for the medical system 100. In some embodiments, one or more components of the medical system 100 (e.g., the medical device 110, the processing device 120, the storage device 130, the terminal(s) 140, the one or more sensors 160, etc.) may communicate information and/or data with one or more other components of the medical system 100 via the network 150. For example, the processing device 120 may obtain image data from the medical device 110 via the network 150. As another example, the processing device 120 may obtain user instruction(s) from the terminal(s) 140 via the network 150. In some embodiments, the network 150 may include one or more network access points. For example, the network 150 may include wired and/or wireless network access points such as base stations and/or internet exchange points through which one or more components of the medical system 100 may be connected to the network 150 to exchange data and/or information.

The one or more sensors 160 may include any suitable sensor that can obtain sensor data indicating and/or including the motion data (e.g., the first data, the second data, the motion data of the subject, etc.) of a subject for the medical system 100. In some embodiments, the sensor data acquired by the one or more sensors 160 may also be used to distinguish different portions of the subject and/or distinguish the subject from other objects around the subject. In other words, at least one of the one or more sensors 160 may be used to identify and/or position different portions of the subject and/or identify and/or position the subject from other objects around the subject. For example, different portions of the subject and/or the subject may be identified from a video acquired by an optical sensor (e.g., a charge-coupled device). As another example, different portions of the subject and/or the subject may be identified from point cloud data acquired by a LiDAR sensor.

Exemplary sensors may include a radar sensor, an optical sensor, a ranging device, a time-of-flight (TOF) device, a structured light scanner, a camera, or the like, or any combination thereof. The one or more cameras and the one or more radars herein may be merely for illustration. In some embodiments, the sensors may directly acquire the motion data. For example, the sensors may include a displacement sensor, a speed sensor, a positioning sensor, etc. These sensors may be arranged on the subject when the subject is scanned by the medical device 110. Data acquired by such a sensor may be the motion data of the subject. In some embodiments, the sensors may acquire sensor data, and then the sensor data may be used to determine the motion data. For example, the sensors may include an optical sensor, a camera (e.g., a digital camera, an analog camera, etc.), a red-green-blue (RGB) sensor, an RGB-depth (RGB-D) sensor, or another device that can capture image data of the subject. The motion data may be determined based on the sensor data (e.g., a video, an image) acquired by the sensors. As another example, the sensors (e.g., a radar, a LiDAR, etc.) may be used to acquire point-cloud data of the subject. The point-cloud data may include a plurality of data points, each of which may represent a physical point on a body surface of the subject and can be described using one or more feature values of the physical point (e.g., feature values relating to the position and/or the composition of the physical point). Exemplary sensors capable of acquiring point-cloud data may include a 3D scanner, such as a 3D laser imaging device, a structured light scanner (e.g., a structured light laser scanner). Merely by way of example, a structured light scanner may be used to execute a scan on the subject to acquire the point cloud data. During the scan, the structured light scanner may project structured light (e.g., a structured light spot, a structured light grid) that has a certain pattern toward the subject. The point-cloud data may be acquired according to the structure light projected on the subject. As another example, the sensors may be used to acquire depth image data of the subject. The depth image data may refer to image data that includes depth information of each physical point on the body surface of the subject, such as a distance from each physical point to a specific point (e.g., an optical center of the sensors). The depth image data may be captured by a range sensing device, e.g., a structured light scanner, a time-of-flight (TOF) device, a stereo triangulation camera, a sheet of light triangulation device, an interferometry device, a coded aperture device, a stereo matching device, or the like, or any combination thereof.

In some embodiments, the sensors 160 may be disposed on various suitable positions for obtaining the motion data or the sensor data. For example, the sensors 160 may be arranged on a component of the medical device 110 (e.g., the scanner 210), such as, on an RF receiving coil, in a cavity around the examination space, on a scanning table, etc. As another example, the sensors 160 may be attached to the subject's clothes (e.g., the position close to the thoracic and abdominal region). In some embodiments, the sensors 160 may be disposed on a suitable position outside the medical device, such as, on the outer surface of a scan cavity, on a ceiling of a treatment room, on the floor of the treatment room, a holder outside the medical device, etc. In some embodiments, the sensors 160 may be part of the medical device 110. In some embodiments, the sensors 160 may be arranged such that the examination space of the medical device 110 may be located in a field of view of the sensors 160.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the storage device 130 may be a data storage including cloud computing platforms, such as a public cloud, a private cloud, a community cloud, and a hybrid cloud, etc. However, those variations and modifications do not depart from the scope of the present disclosure.

FIG. 2 is a schematic diagram illustrating an exemplary medical device according to some embodiments of the present disclosure. As shown in FIG. 2, medical device 200 may include a scanner 210, one or more radars 220, one or more cameras 230, and a processing device 240. The scanner 210 may be configured to scan a subject or at least a part of the subject, and acquire corresponding scan data. The one or more radars 220 may be configured to acquire radar echo data from the subject. In some embodiments, the radar echo data may include data related to a physiological motion of the subject (hereinafter physiological motion related data). In some embodiments, the radar echo data may include the physiological motion related data and data related to a rigid motion of the subject (hereinafter rigid motion related data). The one or more cameras 230 may be configured to acquire a plurality of image frames of the subject. In some embodiments, the rigid motion may be identified based on at least a part of the plurality of image frames. The processing device 240 may be configured to process data/signals acquired by the one or more cameras 230 and the one or more radars 220 (e.g., image data and radar echo data), and generate a control signal for controlling the scanner 210 to scan the subject. In some embodiments, the processing device 240 may be configured to reconstruct an image based on the scan data.

In some embodiments, the scanner 210 may include a CT device, an MRI device, a PET device, an ultrasonic device, an X-ray imaging device, or the like. In some embodiments, the medical device 220 may include a treatment device, e.g., a radiation treatment device, instead of the scanner 210. For example, the imaging device 200 may be the IGRT device. The following description is provided with reference to exemplary embodiments that the medical device includes a scanner 210 for illustration purposes and not intended to be limiting.

The scanner 210 may include various suitable medical imaging devices for diagnosing and/or treating a disease, and not intended to be limiting. Taking the MRI device as an example, a magnetic resonance unit of the MRI device may include a magnet assembly, a gradient coil assembly, and a radiofrequency (RF) coil assembly. For example, the magnet assembly may generate a main magnetic field for polarizing the subject to be scanned. The gradient coil assembly may generate a gradient magnetic field. The RF coil assembly may include a plurality of RF coils for transmitting and/or receiving RF signals. In some embodiments, the magnetic resonance unit may form a cavity providing an examination space. The scanning table may move along the cavity. The subject may be placed on the scanning table for MR imaging.

In some embodiments, the radar of the one or more radars 220 may at least include an antenna and a processing component. In some embodiments, the antenna and the processing component may be integrated into a single chip. In some embodiments, the antenna and the processing component may be disposed separately. In some embodiments, the antenna may transmit radar signals to the subject within a coverage zone in a radar field. The antenna may receive radar echo signals reflected from the subject within the coverage zone. In some embodiments, a radar may include multiple antennas. The detection angle of the antenna may be adjusted according to the position of the subject or at a part of the subject. For example, a detectable region of the multiple antennas may be designed to cover the subject at suitable detection angles (e.g., 60 degrees, 70 degrees, 130 degrees, or 180 degrees) in order to acquire large-scale radar echo data. As another example, a detection region of at a part of the multiple antennas may be designed to cover a region of interest (ROI) of the subject in order to acquire radar echo data regarding the ROI (e.g., a thoracic and abdominal region). In some embodiments, the detection angle of the antenna may be a fixed angle (e.g., 60 degrees). In some embodiments, the radar may be a phased array radar having an antenna array forming by a plurality of antenna units. Each antenna unit may be controlled by a single phase shift switch. The phase beams may be synthesized by controlling the phase beam emitted by each antenna unit.

In some embodiments, the one or more radars 220 may be used to provide a non-invasive remote monitoring for the physiological motion. The one or more radars 220 may be disposed on various suitable positions for monitoring the physiological motion. For example, the one or more radars 220 may be disposed on a component of the scanner 210, such as, on an RF receiving coil, in a cavity around the examination space, or on a scanning table. As another example, the one or more radars 220 may be attached to the subject's clothes (e.g., the position close to the thoracic and abdominal region). In some embodiments, the one or more radars 220 may be disposed on a suitable position outside the medical device, such as, on a ceiling of a treatment room, on the floor of the treatment room, or a holder outside the medical device, etc.

In some embodiments, a distance between the radar and the subject may be 0-25 meters (e.g., less than 5 meters). Alternatively, the distance may be 1 millimeter to 3 meters, such as, 1 meter, or 2 meters. Alternatively, the distance may be 10 millimeters to 3000 millimeters, such as 100 millimeters to 2000 millimeters. The radar may emit radar beams (e.g., electromagnetic waves) to irradiate the subject, and receive radar echo signals reflected by the subject. In some embodiments, an emission frequency of the radar may be set as 1 GHz to 100 GHz. For example, a low-frequency range (e.g., 1 GHz to 50 GHz) may be used to detect an interior movement inside the subject (e.g., a cardiac movement, a diaphragm movement). A high-frequency range of the radar (e.g., 50 GHz to 100 GHz) may be used to detect a body surface movement (e.g., a skin movement). In some embodiments, the emission frequency of the radar may be set as different frequency ranges so as to identify various movements regarding the subject.

In some embodiments, the one or more radars 220 may include a single-mode radar and/or a multi-mode radar. For example, the single-mode radar may include a continuous wave (CW) radar, a non-continuous wave radar (e.g., an ultra-wideband (UWB) radar, or a frequency modulated continuous wave (FMCW) radar), a LIDAR, and so on. The mull-mode radar may include a CW-UWB radar, a CW-FMCW radar, or a UWB-FMCW radar, and so on. The types of the radar may be adjusted according to different scenarios. For example, the CW radar may be activated to monitor the cardiac motion. As another example, the UWB radar may be activated to monitor the abdominal movement. As a further example, a combined use of the CW radar and the UWB radar may be used to detect the radiation in various wavebands (e.g., in the millimeter wavelength range) that is emitted or reflected by the subject.

In some embodiments, the one or more radars 220 may be configured to detect radar echo signals from the subject. The radar echo signals may include motion information regarding the subject (e.g., rigid motion information and/or physiological motion information). For example, the rigid motion may include a translational and/or rotational motion of the subject. Exemplary rigid motions may include a pose motion of the subject, such as the rotating or nodding of the head of the subject, legs motion, hands motion, and so on. As another example, the physiological motion may include respiratory motion (or breathing motion), heart motion (or cardiac motion), and so on. In some embodiments, the radar echo signals may be image data or point cloud data. For example, the radar echo signals may be three-dimensional image data regarding the head of the subject. As another example, the radar echo signals may be point cloud data including location information of one or more characteristic points (e.g., the highest point coordinates and the lowest point coordinates of the abdominal). In some embodiments, the radar echo signals may be desired to determine a physiological motion of the subject. One or more parameters (e.g., cardiac motion data or respiratory motion data) of the physiological motion may be used to control the scan of the medical device, which may reduce or avoid motion artifacts (e.g., motion artifacts caused by the cardiac motion or the breathing motion) in a reconstructed image. However, the radar echo signals may include disturbed signals caused by the rigid motion of the subject. The disturbed signals may be filtered in a subsequent processing operation. The use of the one or more radars 220 may be an effective physiological motion detection means instead of conventional means. For example, the conventional means may require one or more electrodes and/or respiratory zones attached to the body of the subject in order to detect the physiological motion of the subject, which may cause more or less discomfortable feeling for some subjects. By contrast, the use of the radar may reduce the discomfortable feeling, and ignore an installing time of the electrodes and/or respiratory zones, which may reduce the scan time of the medical device.

In some embodiment, the design of the one or more cameras 230 may aim at obtaining rigid motion information. The camera of the one or more cameras 230 may include a three-dimensional (3D) camera, such as a time of flight (TOF) camera, a structural light camera, a binocular camera, a LIDAR camera, or the like, or any combination thereof. The 3D camera may be configured to capture a position and/or depth information of a subject. The 3D image or model may be reconstructed based on the captured position and/or depth information. It should be noted that light signals captured by the camera do not interfere with the radar echo signals captured by the radar. In some embodiments, the one or more cameras 230 may include various commercially available image capture devices for imaging. For example, the one or more cameras 230 may be configured to generate video images of the subject. The video images may include a sequence of image frames of the subject. The rigid motion may be identified by analyzing the sequence of image frames. In some embodiments, motion parameters regarding the rigid motion may be used to correct the radar echo data captured by the one or more radars 220. The corrected radar echo data may be used to generate accurate physiological information.

In some embodiments, the one or more cameras 230 may be disposed on various suitable positions for monitoring the rigid motion of the subject. For example, the one or more cameras 230 may be disposed on a component of the scanner 210, such as, on an RF receiving coil, in a cavity around the examination space, or on a scanning table. In some embodiments, the one or more cameras 230 and the one or more radars 220 may be disposed at the same position in the examination space of the scanner 210. In some embodiments, the one or more cameras 230 and the one or more radars 220 may be disposed at different positions, respectively. For example, the one or more radars 220 may be disposed in the cavity, and the one or more cameras 230 may be disposed on the RF receiving coil. In some embodiments, positions of the one or more cameras 230 and the one or more radars 220 may be adjusted according to the position of the subject, in order to detect corresponding signals from the subject within their coverage zone. The use of one or more cameras 230 is also a non-contactless detection for the subject, which may reduce the comfortless feeling of the subject by contract with contactless detection. In some embodiments, the one or more cameras 230 may be aligned at a certain angle towards the subject or at least a part of the subject, in order to obtain a larger detection angle and large-scale detection data.

In some embodiments, the radar and the camera may be integrated into a radar-camera sensor module (not shown in FIG. 2). The integrated radar-camera sensor module includes a radar component for transmitting radar signals and receiving reflected radar signals (i.e., radar echo signals) that are reflected from one or more objects within a coverage zone in a radar field. The integrated radar-camera sensor module further includes a camera component for capturing images based on light waves that are seen and captured within a coverage zone in a camera field. In some embodiments, the radar component and the camera component may be housed in a common housing. The common housing may be made of various materials, such as rigid materials, or non-rigid materials. In some embodiments, the radar component and the camera component may be coupled to processing circuits for processing the captured images and the received reflected radar signals, such as fusing the captured images and the reflected radar signals. The fused data may be used to indicate vital signs of the subject, such as respiratory motion, heart motion.

In some embodiments, the camera component may include a plurality of optical elements and an imager. The camera component may include a commercially available image capture device for imaging. For example, the camera component may be configured to generate video images of the subject. The video images may include a plurality of image frames. In some embodiments, the radar component may include a radar transceiver coupled to an antenna. The transceiver and antenna operate to transmit radar signals within the desired coverage zone, and to receive radar echo signals reflected from the subject within the coverage zone. In some embodiments, the radar component may transmit a single fan-shaped radar beam and form multiple beams by receiving digital beamforming. In some embodiments, the antenna may include a vertical polarization antenna and/or a horizontal polarization antenna. The vertical polarization antenna may provide vertical polarization of the radar signals. The horizontal polarization antenna may provide horizontal polarization of the radar signals.

It should be noted that the above description of the medical device 200 is intended to be illustrative, and not to limit the scope of the present disclosure. For persons having ordinary skills in the art, multiple variations and modifications may be made under the teachings of the present disclosure. However, those variations and modifications do not depart from the scope of the present disclosure. For example, the one or more cameras 230 and the one or more radars 220 may be and/or include any suitable device that is capable of capturing motion data (e.g., the first data, the second data, etc.) of the subject.

Figure 3:
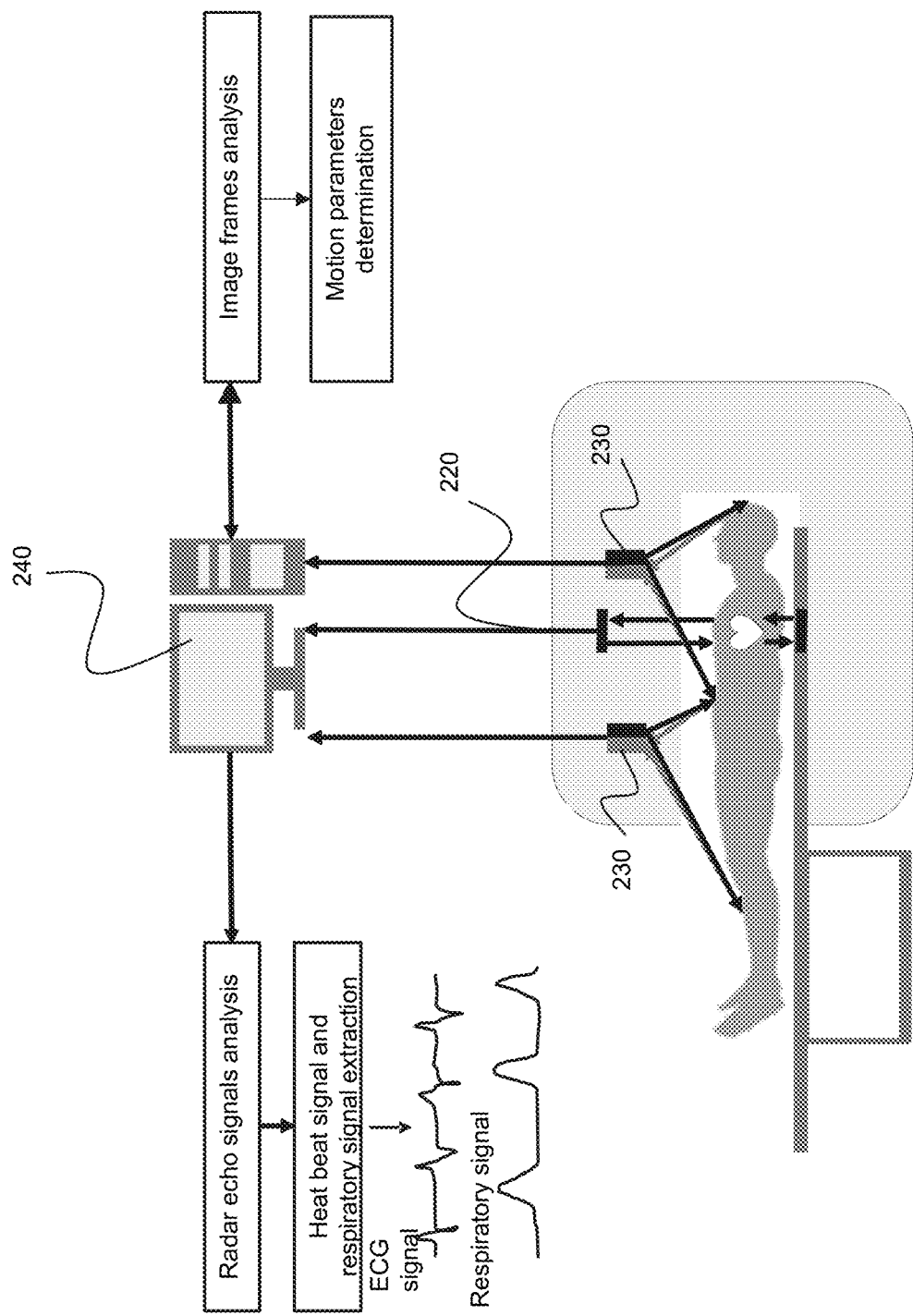
FIG. 3 is a schematic diagram illustrating an exemplary work scheme according to some embodiments of the present disclosure.

FIG. 3 is a schematic diagram illustrating an exemplary work scheme according to some embodiments of the present disclosure. As shown in FIG. 3, a radar 220 and two cameras 230 may be arranged in the examination space of the medical device. The radar 220 may be configured to acquire radar echo signals from the subject. The radar echo signals may provide information related to a physiological motion of the subject (e.g., respiratory motion, or heart motion). In some cases, the radar echo signals may include disturbed signals caused by a rigid motion of the subject (e.g., a head movement, a leg movement, a hand movement, etc.). The two cameras 230 may be configured to capture a plurality of image frames included the subject. The plurality of image frames may provide information related to the rigid motion of the subject. In some embodiments, the processing device 240 may perform one or more fusion operations for the plurality of image frames and the radar echo signals. For example, the one or more fusion operations may include image frames analysis and radar echo signals analysis. In some embodiments, the processing device 240 may perform the image frames analysis to determine one or more motion parameters regarding the rigid motion. The determined motion parameters may be transformed into a coordinate system corresponding to the radar 220. In some embodiments, the processing device 240 may perform the radar echo signals analysis to determine data related to the physiological motion, such as heart beat signal and/or respiratory signal as shown in FIG. 3. In some embodiments, the heart beat signal may be an electrocardiogram (ECG) signal. In some embodiments, the radar echo signal analysis may include one or more operations for correcting the radar echo signals based on the motion parameters regarding the rigid motion. For example, the processing device 240 may correct the radar echo signals by filtering out the disturbing signals caused by the rigid motion, and extract the heart beat signals (e.g., ECG signals) and the respiratory signals. In some embodiments, the extracted heat beat signals and/or respiratory signals may be used to control one or more scan operations of the medical device (e.g., the MRI device). In some embodiments, the processing device 240 may reconstruct a medical image (e.g., an MR image) based on the scan data acquired by the medical device (e.g., the MRI device). More descriptions about the image frames analysis and the radar echo signal analysis may be found elsewhere in the present disclosure (e.g., FIG. 7A and FIG. 8, and the descriptions thereof).

Figure 4:
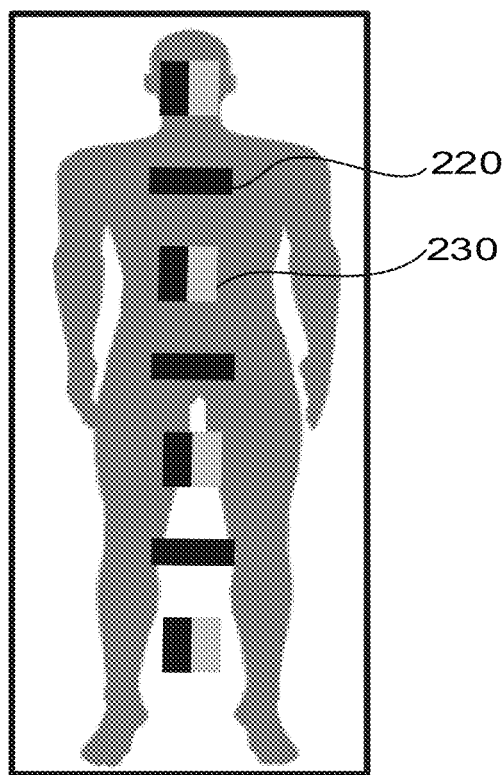
FIG. 4 is a schematic diagram illustrating an exemplary data acquisition according to some embodiments of the present disclosure.

FIG. 4 is a schematic diagram illustrating an exemplary data acquisition according to some embodiments of the present disclosure. In some embodiments, the one or more radars 220 and the one or more cameras 230 may acquire corresponding data simultaneously in response to a clock signal from a system clock of the medical device. In some embodiments, as illustrated in FIG. 4, the one or more radars 220 and the one or more cameras 230 may alternately capture corresponding data regarding various parts of the subject at different time points. In some embodiments, the detection angles of the one or more cameras 230 and the one or more radars 220 may be set according to a region of interest (ROI) of the subject. The ROI of the subject may be any part of the subject, such as the head, the chest, a leg, and so on. For example, when the ROI is the chest region, the detection angle of the camera may be set as 60 degrees, and the detection angle of the radar may be set as 90 degrees. The one or more cameras 230 and the one or more radars 220 may acquire data within their own coverage zone. The acquired data may be used to characterize the motion of the subject (e.g., the physiological motion, or the rigid motion).

Figure 5:
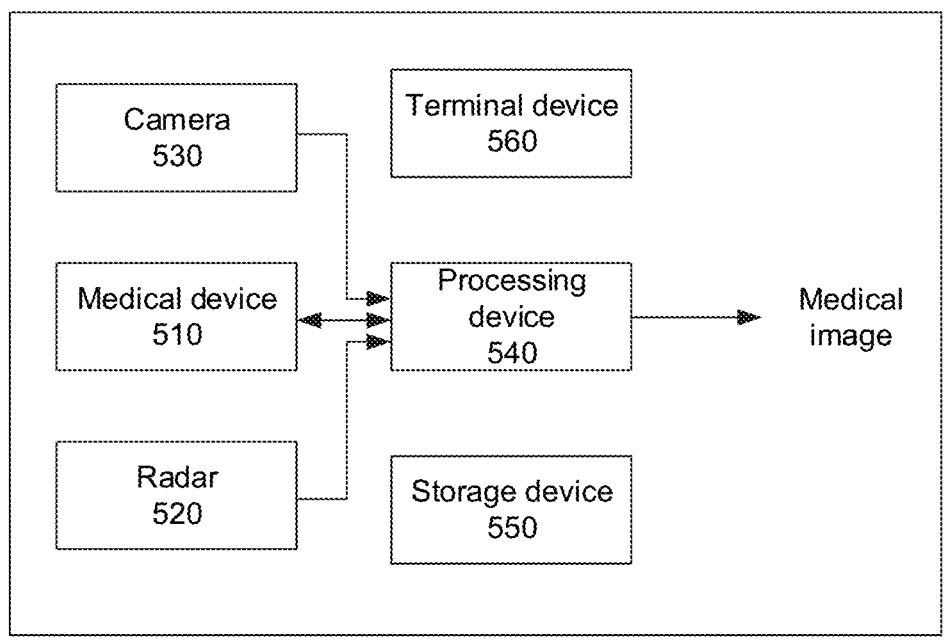
FIG. 5 is a block diagram illustrating an exemplary medical imaging system according to some embodiments of the present disclosure.

FIG. 5 is a block diagram illustrating an exemplary medical imaging system according to some embodiments of the present disclosure. As illustrated in FIG. 5, the medical imaging system 500 may include a medical device 510, a radar 520, a camera 530, a processing device 540, a storage device 550, and a terminal device 560. In some embodiments, the medical device 510 may scan a subject or at a part of the subject (e.g., an ROI of the subject). The radar 520 may acquire radar echo signals from the subject. The camera 530 may acquire a plurality of image frames including the subject. The processing device 540 may process the radar echo signals and the plurality of image frames to generate a control signal for controlling the medical device. In response to the control signal, the medical device 510 may obtain accurate scan data. The processing device 540 may reconstruct a medical image based on the scan data. In some embodiments, one or more components of the medical imaging system 500 (e.g., the camera 530, the radar 520, or the medical device 510) may be connected by various means. For example, the medical device 510, the radar 520, the camera 530, the terminal device 560, and/or the storage device 550 may be connected to the processing device 540 via a network (e.g., the network 150), or be connected to the processing device 540 directly.

In some embodiments, the medical device 510 may be used in medical treatments and/or diagnosis. The medical device 510 may be the same as or similar to the medical device 110 as illustrated in FIG. 1. Taking the IGRT device as an example, the IGRT device may irradiate a target (e.g., a lesion (or a tumor)) using various radioactive rays, such as, X-rays, y-rays, electron lines, proton beams, and so on. The IGRT device may include an accelerator (e.g., a linear accelerator or a cyclotron). The linear accelerator may generate and emit the radioactive rays (e.g., X-rays) to the target for killing cancer cells. A therapeutic effect on the tumor may be achieved. The accelerator may rotate with a gantry of the IGRT device in the clockwise or counterclockwise direction around an axis of the rack. The IGRT device may include a treatment table for supporting the subject. In some embodiments, the treatment table may be a six-dimensional platform capable of performing a linear motion in three directions of x, y, and z, and a rotational motion in three directions of x, y, and z. The treatment table may move the subject to a corresponding position (e.g., a target zone) accurately and/or quickly.

In some embodiments, the radar 520 may be the same as or similar to the radar 220. For example, the radar 520 may include a single-mode radar and/or a multi-mode radar. For example, the single-mode radar may include a continuous wave (CW) radar, a non-continuous wave radar (e.g., an ultra-wideband (UWB) radar, or a frequency modulated continuous wave (FMCW) radar), a light detection and ranging (LIDAR) device, and so on. The multi-mode radar may include a CW-UWB radar, a CW-FMCW radar, or a UWB-FMCW radar, and so on. In some embodiments, the camera 530 may be the same as or similar to the camera 230. For example, the camera may include a three-dimensional (3D) camera, such as a time of flight (TOF) camera, a structured light camera, a binocular camera, a LIDAR camera, or the like, or any combination thereof. More descriptions of the radar and the camera may be found elsewhere in the present disclosure. See, e.g., FIG. 2, and the descriptions thereof.

In some embodiments, the processing device 540 may process data and/or information obtained from the medical device 510, the terminal device 560, the storage device 550, the camera 530, and/or the radar 520. For example, the processing device 540 may determine first data regarding a first motion of the subject. The first motion may include a rigid motion of the subject. The first data may be rigid motion related data, such as motion parameters. As another example, the processing device 540 may determine second data regarding a second motion of the subject. The second motion may include a physiological motion of the subject. The second data may be physiological motion related data, such as cardiac motion data or respiratory motion data. As a further example, the processing device 540 may generate a control signal for controlling the device based on the first data and the second data. As yet another example, the processing device 540 may obtain a plurality of sets of motion data each of which corresponds to one of a plurality of motion phases of a subject. A set of motion data may correspond to a motion phase including internal motion data reflecting an internal motion of the subject during the motion phase and surface motion data reflecting a surface motion of the subject during the motion phase. The processing device 540 may direct a radiotherapy device to deliver a radiation treatment to the subject according to a treatment plan. During the radiation treatment, the processing device 540 may obtain target surface motion data reflecting the surface motion of the subject; and adjust the treatment plan to adapt to the internal motion of the subject based on the target surface motion data and the plurality of sets of motion data. In some embodiments, the processing device 540 may be the same as or similar to the processing device 120 illustrated in FIG. 1. For example, the processing device 540 may be a single server or a server group. As another example, the processing device 540 may include a central processing unit (CPU), an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction-set computer (RISC), a microprocessor, or the like, or any combination thereof.

In some embodiments, the storage device 550 may store data and/or instructions. In some embodiments, the storage device 550 may store data obtained from medical device 510, the radar 520, the camera 530, the processing device 540, and the terminal device 560. In some embodiments, the storage device 550 may store data and/or instructions that the processing device 540 may execute or use to perform exemplary methods described in the present disclosure. The storage device 550 may be the same as or similar to the storage device 130 illustrated in FIG. 1. For example, the storage device 550 may include a mass storage device, a removable storage device, a volatile read-and-write memory, a read-only memory (ROM), or the like, or any combination thereof.

In some embodiments, the terminal device 560 may be connected to and/or communicate with the medical device 510, the radar 520, the camera 530, the processing device 540, and/or the storage device 550. For example, the terminal device 560 may obtain a processed image from the processing device 540. As another example, the terminal device 560 may obtain scan data acquired by the medical device 510 and transmit the scan data to the processing device 540 to be processed. In some embodiments, the terminal device 560 may be the same as or similar to the terminal(s) 140 illustrated in FIG. 1. For example, the terminal device 560 may include a mobile device, a tablet computer, a laptop computer, or the like, or any combination thereof.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. For example, the storage device 550 may be a data storage including cloud computing platforms, such as, a public cloud, a private cloud, a community cloud, and a hybrid cloud, etc. As another example, the radar 520 and the camera 530 may be and/or include any suitable device that is capable of capturing motion data (e.g., the first data, the second data, the surface motion data, etc.) of the subject. However, those variations and modifications do not depart from the scope of the present disclosure.

Figure 6:
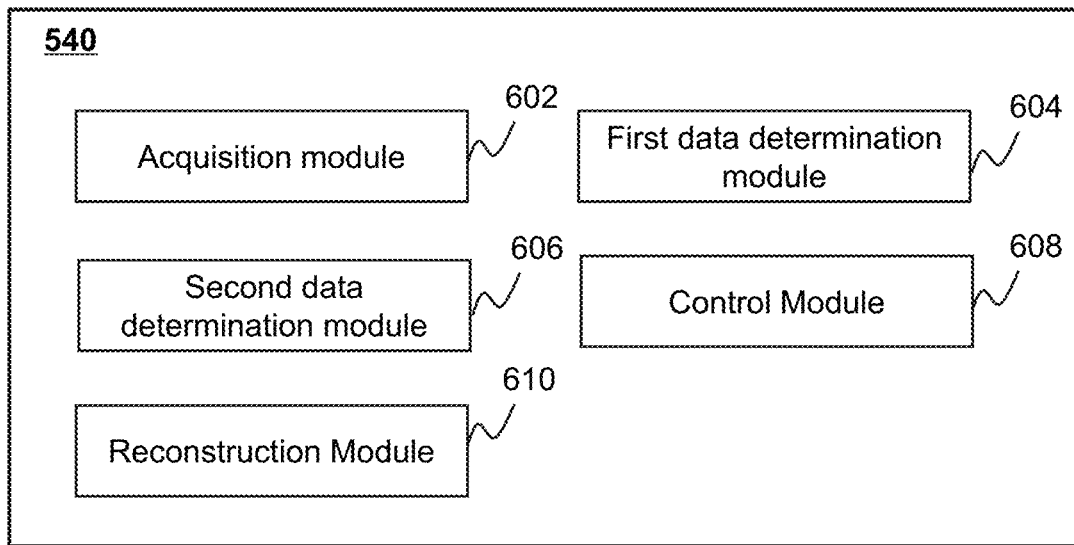
FIG. 6 is a block diagram illustrating an exemplary processing device according to some embodiments of the present disclosure.

FIG. 6 is a block diagram illustrating an exemplary processing device according to some embodiments of the present disclosure. In some embodiments, the processing device 540 may be in communication with a computer-readable storage medium (e.g., the storage device 550 illustrated in FIG. 5, the storage device 130 illustrated in FIG. 1) and may execute instructions stored in the computer-readable storage medium. The processing device 540 may include an acquisition module 602, a first data determination module 604, a second data determination module 606, a control module 608, and a reconstruction module 610.

The acquisition module 602 may be configured to acquire data from one or more modules of the processing device 540. In some embodiments, the acquisition module 602 may obtain first data regarding a first motion of a subject in an examination space of a medical device. In some embodiments, the first data determination module 604 may determine the first data regarding the first motion. The acquisition module 602 may obtain the first data from the first data determination module 604. In some embodiments, the acquisition module 602 may acquire a plurality of image frames of the subject through one or more cameras. The one or more cameras may be installed on the medical device. The plurality of image frames may be used to determine the first data. In some embodiments, the acquisition module 602 may obtain second data regarding a second motion of the subject. In some embodiments, the second data determination module 606 may determine the second data regarding the second motion of the subject. The acquisition module 602 may obtain the second data from the second data determination module 606. In some embodiments, the acquisition module 602 may acquire radar echo data through one or more radars. The one or more radars may be installed on the medical device. The radar echo data may be used to determine the second data. In some embodiments, the first motion may include a rigid motion, and the second motion may include a physiological motion.

The first data determination module 604 may determine, based on at least a part of the plurality of image frames, first data including one or more motion parameters. For example, the first data determination module 604 may process the plurality of image frames to identify the rigid motion of the subject. For example, the first data determination module 604 may determine one or more motion parameters of the first motion based on at least a part of the plurality of image frames. In some embodiments, the one or more motion parameters may include a three-dimensional translation matrix and/or a three-dimensional rotation matrix. In some embodiments, the first data determination module 604 may determine the one or more motion parameters using an image registration technique. Exemplary image registration techniques may include but not be limited to a pixel-based registration algorithm, a feature-based registration algorithm, a contour-based registration algorithm, a mutual information-based registration algorithm, and so on. More descriptions of the determination of the first data may be found elsewhere in the present disclosure (e.g., FIG. 8 and the description thereof).

The second data determination module 606 may determine the second data regarding the second motion of the subject. In some embodiments, the second motion may include a physiological motion of the subject. The physiological motion may include a heart motion and/or respiratory motion of the subject. In some embodiments, the second data determination module 606 may process the radar echo data to identify the physiological motion of the subject. For example, the second data determination module 606 may correct the acquired radar echo data by filtering out disturbed information caused by the rigid motion. The second data determination module 606 may extract the second data from the corrected radar echo data. The second data may include cardiac motion data or respiratory motion data. More descriptions of the determination of the second data may be found elsewhere in the present disclosure (e.g., FIG. 8 and the description thereof).

The control module 608 may generate, based on the first data and the second data, a control signal for controlling the medical device to scan at least a part of the subject. More specifically, the control module 608 may generate the control signal based on the cardiac motion data and/or the respiratory motion data. The cardiac motion data and/or the respiratory motion data may be determined based on the first data and the second data. In some embodiments, the control module 608 may generate the control signal using a gating technique. The gating technique may include a cardiac gating and a respiratory gating. In response to the control signal, the medical device may be directed to scan the subject or at least a part of the subject.

The reconstruction module 610 may reconstruct a medical image based on the scan data acquired by the medical device. For example, the reconstruction module 610 may reconstruct the image using one or more reconstruction algorithms. The one or more reconstruction algorithms may include but not limited to a 2-dimensional Fourier transform technique, a back projection technique (e.g., a convolution back projection technique, a filtered back projection technique), an iteration reconstruction technique, etc. Examples of iterative reconstruction techniques may include a simultaneous algebraic reconstruction technique (SART), a simultaneous iterative reconstruction technique (SIRT), an ordered subset convex technique (OSC), ordered subset maximum likelihood methodologies, an ordered subset expectation maximization (OSEM) methodology, an adaptive statistical iterative reconstruction technique (ASIR) methodology, a least squares QR methodology, an expectation maximization (EM) methodology, an OS-separable paraboloidal surrogates technique (OS-SPS), an algebraic reconstruction technique (ART), a Kacsmarz reconstruction technique, or any other iterative reconstruction technique or methodology that meets application-specific requirements.

It should be noted that the descriptions above in relation to processing device 540 are provided for the purposes of illustration, and not intended to limit the scope of the present disclosure. For persons having ordinary skills in the art, various variations and modifications may be conducted under the guidance of the present disclosure. However, those variations and modifications do not depart the scope of the present disclosure. In some embodiments, the processing device 540 may include one or more other modules. For example, the processing device 540 may include a storage module to store data generated by the modules in the processing device 540. In some embodiments, any two of the modules may be combined as a single module, and any one of the modules may be divided into two or more units.

Figure 7A:
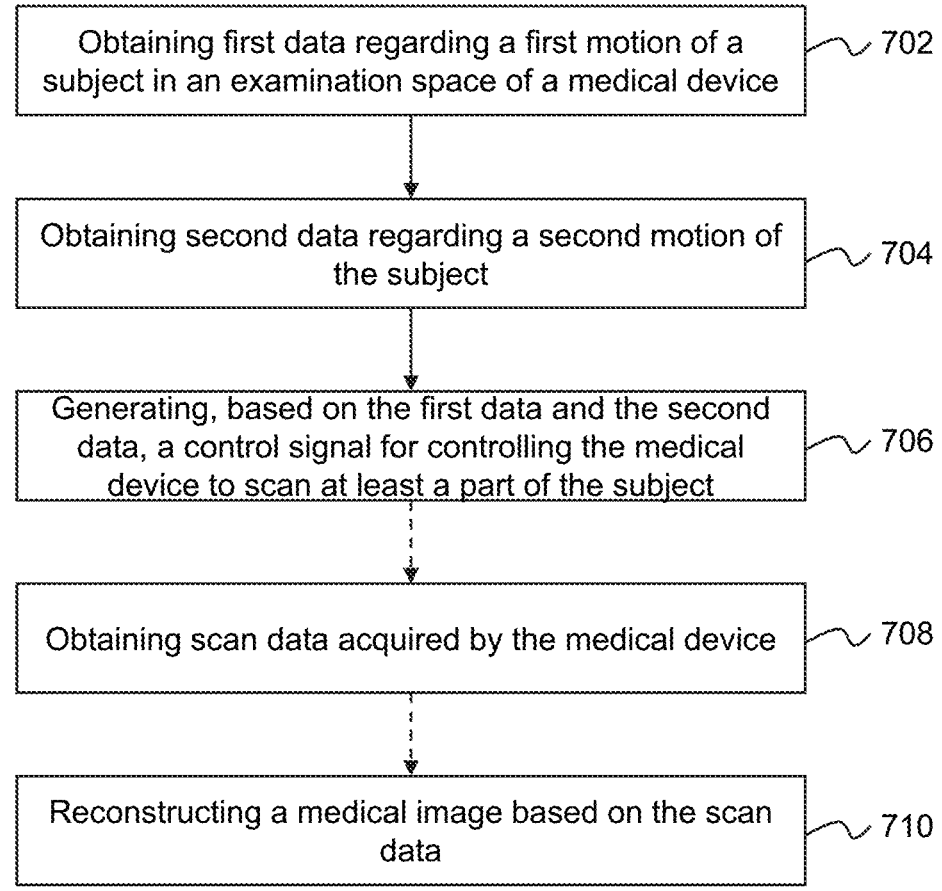
FIG. 7A is a flowchart illustrating an exemplary process for controlling a medical device according to some embodiments of the present disclosure.

FIG. 7A is a flowchart illustrating an exemplary process for controlling a medical device according to some embodiments of the present disclosure. Process 700 may be implemented in the medical system 100 illustrated in FIG. 1 or the medical imaging system 500 illustrated in FIG. 5. For example, the process 700 may be stored in the storage device 130 and/or the storage device 550 in the form of instructions (e.g., an application), and invoked and/or executed by the processing device 120 (e.g., the processing device 540 illustrated in FIG. 5, or one or more modules in the processing device 540 illustrated in FIG. 6). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting.

In 702, the processing device (e.g., the acquisition module 602 of the processing device 540) may obtain first data regarding a first motion of a subject in an examination space of a medical device. In some embodiments, the first data determination module 604 of the processing device 540 may determine the first data regarding the first motion of the subject in the examination space of the medical device. The acquisition module 602 may obtain the first data from the first data determination module 604. In some embodiments, the first motion may refer to a rigid motion. The rigid motion may include a translational and/or rotational motion of the subject. Exemplary rigid motions may include a pose motion of the subject, such as the rotating or nodding of the head of the subject, a motion of a leg, a motion of a hand, and so on. The first data may refer to data related to the first motion (e.g., the rigid motion). Hereinafter the first data may be referred to as first motion related data, rigid motion related data, or pose motion related data.

In some embodiments, the acquisition module 602 may acquire, via one or more cameras (e.g., the one or more cameras 230, or the camera 530), a plurality of image frames regarding the first motion of the subject in the examination space of the medical device. The one or more cameras may capture the plurality of image frames including the subject. The plurality of image frames may be sent to the acquisition module 602. The first data determination module 604 may process the plurality of image frames to identify the rigid motion of the subject. For example, the first data determination module 604 may determine one or more motion parameters of the first motion based on at least a part of the plurality of image frames. In some embodiments, the one or more motion parameters may include a three-dimensional translation matrix and/or a three-dimensional rotation matrix. In some embodiments, the first data determination module 604 may determine the one or more motion parameters using an image registration technique. Exemplary image registration techniques may include a pixel-based registration algorithm, a feature-based registration algorithm, a contour-based registration algorithm, a mutual information-based registration algorithm, and so on. More descriptions of the determination of the first data may be found elsewhere in the present disclosure (e.g., FIG. 8 and the description thereof).

In 704, the processing device (e.g., the acquisition module 602 of the processing device 540) may obtain second data regarding a second motion of the subject. In some embodiments, the second data determination module 606 of the processing device 540 may determine the second data regarding the second motion of the subject. The acquisition module 602 may obtain the second data from the second data determination module 606. In some embodiments, the second motion may include a physiological motion of the subject. The physiological motion may include a cardiac motion, a respiratory motion, or the like, of the subject. The second data may refer to data related to the second motion (e.g., the physiological motion). Hereinafter the second data may be referred to as second motion related data, or physiological motion related data.

In some embodiments, the acquisition module 602 may acquire, via one or more radars (e.g., the one or more radars 220, or the radar 520), radar echo data from the subject. For example, the one or more radars may emit radar signals to the subject or at least a part of the subject, and receive the radar echo signals reflected from the subject. The radar echo signals may include motion information of the subject. The motion information may include not only the physiological motion information, but also the rigid motion information. In this case, the radar echo signals caused by the rigid motion may be designated as disturbed signals. The acquired radar echo data may be sent to the acquisition module 602. The second data determination module 606 may process the radar echo data to identify the physiological motion of the subject. For example, the second data determination module 606 may correct the acquired radar echo data by filtering out the disturbed information caused by the rigid motion. The second data determination module 606 may extract the second data from the corrected radar echo data. The second data may include cardiac motion data or respiratory motion data. More descriptions of the determination of the second data may be found elsewhere in the present disclosure (e.g., FIG. 8 and the description thereof).

In 706, the processing device (e.g., a control module 608 of the processing device 540) may generate, based on the first data and the second data, a control signal for controlling the medical device to scan at least a part of the subject. In some embodiments, the processing device 540 may generate accurate cardiac motion data and/or respiratory motion data based on the first data and the second data. The accurate cardiac motion data and respiratory motion data may facilitate to reduce or avoid motion artifacts (e.g., cardiac motion artifacts or respiratory motion artifacts) in a reconstructed image. For example, the second data determination module 606 may correct the radar echo data according to the one or more motion parameters of the first motion. The disturbed component of the radar echo data may be removed by the correction. The cardiac motion data and/or the respiratory motion data extracted from the corrected radar echo data may be more accurate than the uncorrected radar echo data. In some embodiments, the control module 608 may generate the control signal using a gating technique. The gating technique may be used for synchronization of signal (e.g., an MR signal) acquisition to the cardiac and/or respiratory cycle.

Figure 7B:
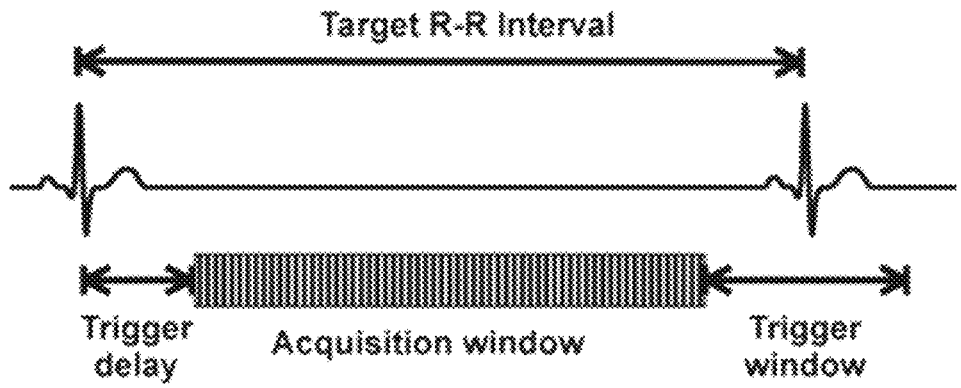
FIG. 7B is a schematic diagram illustrating an exemplary cardiac gating according to some embodiments of the present disclosure.

In some embodiments, the gating technique may include a cardiac gating and/or a respiratory gating. For example, the cardiac gating may be based on cardiac motion data (e.g., an ECG signal). The ECG signal may show a plurality of cardiac cycles. Each cardiac cycle may correspond to a heartbeat. In some embodiments, one cardiac cycle may be a time interval between two R-waves of the ECG signal. Merely by way of example, FIG. 7B illustrates an exemplary cardiac gating according to some embodiments of the present disclosure. As illustrated in FIG. 7B, in a specific time point between two R-waves (e.g., an end of a trigger delay, or a beginning of an acquisition window), the control module 608 may generate a control signal (e.g., a gating signal) for triggering the medical device (e.g., the MRI device) to scan in order to acquire scan data. The trigger delay may be defined as the time interval between the first R-wave and the beginning of data acquisition. The scan data may be acquired during the acquisition window. The control module 608 may generate the control signal for each scan based on the ECG signal. The use of the cardiac gating technique may facilitate to reduce or avoid the cardiac motion artifacts.

Figure 7C:
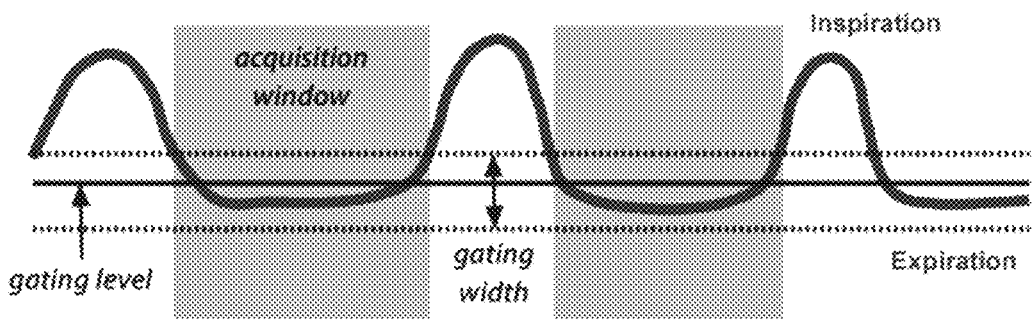
FIG. 7C is a schematic diagram illustrating an exemplary respiratory gating according to some embodiments of the present disclosure.

As another example, FIG. 7C illustrates an exemplary respiratory gating according to some embodiments of the present disclosure. The respiratory gating may be based on respiratory data. The respiratory data may show a plurality of respiratory cycles as shown in FIG. 7C. The respiratory cycle may be a cycle of inspiration and expiration. The acquisition window may be defined as a time interval when an amplitude of the respiratory signal is within the gating width. The scan data may be acquired during the acquisition window. In some embodiments, when the amplitude of the respiratory signal is within the gating width, the control module 608 may generate a control signal (e.g., a gating signal) for triggering the medical device (e.g., the MRI device) to scan and acquiring scan data during expiration (when least diaphragmatic movement occurs).

In some embodiments, the gating technique may be used to control various medical devices for reducing motion artifacts. For example, an ECG-gated technique may be used to perform a CT scan (e.g., for cardiac imaging). As another example, the respiratory and cardiac gating technique may be used to perform a PET scan (e.g., for cardiac PET imaging). As a further example, the respiratory gating may be used to monitor the movement of a tumor during normal breathing of a subject in a radiotherapy session. When the tumor moves outside a target field, a gating signal for turning off the treatment beam may be generated according to the respiratory gating.

In 708, the processing device (e.g., the acquisition module 602 of the processing device 540) may obtain scan data acquired by the medical device. For example, in response to the control signal, the medical device may be directed to scan the subject or at least part of the subject. In some embodiments, the scan data may be stored in the storage device 130. The acquisition module 602 may send the scan data to the reconstruction module 610 for further processing.

In 710, the processing device (e.g., the reconstruction module 610 of the processing device 540) may reconstruct a medical image based on the scan data. In some embodiments, the reconstruction module 610 may reconstruct the image using one or more reconstruction algorithms. For example, the one or more reconstruction algorithms may include a 2-dimensional Fourier transform technique, a back projection technique (e.g., a convolution back projection technique, a filtered back projection technique), an iteration reconstruction technique, etc. Examples of iterative reconstruction techniques may include a simultaneous algebraic reconstruction technique (SART), a simultaneous iterative reconstruction technique (SIRT), an ordered subset convex technique (OSC), ordered subset maximum likelihood methodologies, an ordered subset expectation maximization (OSEM) methodology, an adaptive statistical iterative reconstruction technique (ASIR) methodology, a least squares QR methodology, an expectation maximization (EM) methodology, an OS-separable paraboloidal surrogates technique (OS-SPS), an algebraic reconstruction technique (ART), a Kacsmarz reconstruction technique, or any other iterative reconstruction technique or methodology that meets application-specific requirements.

It should be noted that the description of the process 700 is provided for the purposes of illustration, and not intended to limit the scope of the present disclosure. For persons having ordinary skills in the art, various variations and modifications may be conducted under the teaching of the present disclosure. For example, operations 702 and 704 may be integrated into a single operation. As another example, operations 704 and 706 may be integrated into a single operation. However, those variations and modifications may not depart from the protection of the present disclosure.

Figure 8:
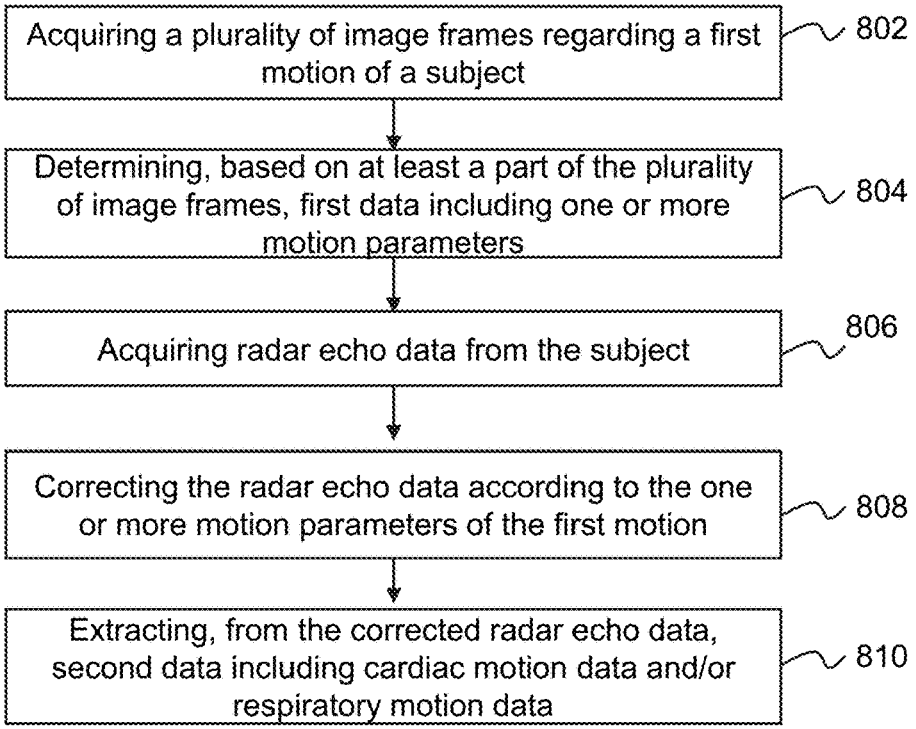
FIG. 8 is a flowchart illustrating an exemplary process for extracting physiological motion related data according to some embodiments of the present disclosure.

FIG. 8 is a flowchart illustrating an exemplary process for extracting physiological motion related data according to some embodiments of the present disclosure. Process 800 may be implemented in the medical system 100 illustrated in FIG. 1 or the medical imaging system 500 illustrated in FIG. 5. For example, the process 800 may be stored in the storage device 130 and/or the storage device 550 in the form of instructions (e.g., an application), and invoked and/or executed by the processing device 120 (e.g., the processing device 540 illustrated in FIG. 5, or one or more modules in the processing device 540 illustrated in FIG. 6). The operations of the illustrated process presented below are intended to be illustrative. In some embodiments, the process 800 may be accomplished with one or more additional operations not described, and/or without one or more of the operations discussed. Additionally, the order in which the operations of the process 800 as illustrated in FIG. 8 and described below is not intended to be limiting.

In 802, the processing device (e.g., the acquisition module 602 of the processing device 540) may acquire a plurality of image frames regarding a first motion of a subject.

In some embodiments, the first motion may refer to a rigid motion. The rigid motion may include a translational and/or rotational motion of the subject. Exemplary rigid motions may include a pose motion of the subject, such as the rotating or nodding of the head of the subject, leg motion, hand motion, and so on. The rigid motion may be identified by a sequence of image frames. In some embodiments, one or more cameras (or other image capture devices) installed on the medical device (e.g., the medical device 110 or the medical device 510) may capture the sequence of image frames of the subject. The one or more cameras may be installed on suitable positions of the medical device in order to capture the sequence of image frames of the subject. In some embodiments, the captured image frames may be stored in a storage device (e.g., the storage device 130 or the storage device 550). The acquisition module 602 may acquire the image frames from the storage device.

In 804, the processing device (e.g., the first data determination module 604 of the processing device 540) may determine, based on at least a part of the plurality of image frames, first data including one or more motion parameters.

In some embodiments, the first data may refer to data related to the first motion (e.g., the rigid motion). In some embodiments, the first data determination module 604 may determine the one or more motion parameters according to the at least a part of the plurality of image frames. The one or more motion parameters may include a three-dimensional translation matrix and/or a three-dimensional rotation matrix. The rigid motion (i.e., the first motion) may be measured by the one or more motion parameters.

In some embodiments, the one or more motion parameters may be determined using a tracking marker. Specifically, the tracking marker may be fixed on the subject or an ROI of the subject during the scan of the medical device. The tracking marker may be represented as a specific image texture in an image frame. In some embodiments, the rigid motion of the subject may be identified by tracking the motion of the tracking marker in at least two of the plurality of image frames. The first data determination module 604 may segment the tracking marker and the subject (or the ROI of the subject) from the image frame. The first data determination module 604 may obtain coordinates of the tracking marker in different image frames, respectively. The obtained coordinates are the coordinates in the camera coordinate system (hereinafter camera coordinates related to the tracking marker). The first data determination module 604 may determine the motion parameters based on the camera coordinates related to the tracking marker in different image frames.

Assuming that $f_0$ denotes a first image frame captured at the time point $t_0$, $f_1$ denotes a second image frame captured at the time point $t_1$. $X_{c0}$ denotes the coordinates related to the tracking marker at $t_0$, and $X_{c1}$ denotes the coordinates related to the tracking marker at $t_1$. Let $R_c$ be a rotation matrix and $T_c$ be a translation matrix for the rigid motion of the tracking marker between $t_0$ and $t_1$, respectively. The rigid motion may be described by Equation (1) as follows:

$$X_{c1} = R_c X_{c0} + T_c. \tag{1}$$

In some embodiments, $X_{c0}$ and $X_{c1}$ may be a 3×N dimensional matrix, where N denotes the number (or count) of the tracking marker(s). In some embodiments, Equation (2) may be introduced to determine $R_c$ and $T_c$:

$$C = [X_{c0} - \overline{X_{c0}}][X_{c1} - X_{c1}], \tag{2}$$

where $\overline{X_{c0}}$ and $\overline{X_{c1}}$ are mean coordinate matrices of N tracking markers, respectively. In some embodiments, the first data determination module 604 may solve Equation (2) using, e.g., singular value decomposition (SVD). $R_c$ and $T_c$ may be determined based on the solutions of Equation (2). In some embodiments, if $R_c$ and $T_c$ are zero matrices, then no rigid motion exists between the time points $t_0$ and $t_1$. In other words, the subject did not move between the time points $t_0$ and $t_1$. In some embodiments, if at least one of $R_c$ and $T_c$ is a non-zero matrix, there may exist rigid motion between the time points $t_0$ and $t_1$. In other words, the subject may have moved between the time points $t_0$ and $t_1$. The rigid motion may be identified based on the motion parameters. In some embodiments, the rigid motion related data (e.g., the motion parameters) may be fed back to the one or more radars.

In 806, the processing device (e.g., the acquisition module 602 of the processing device 540) may acquire radar echo data from the subject. In some embodiments, the radar echo data and the plurality of image frames may be acquired simultaneously by the one or more radars and the one or more cameras, respectively. That is, operation 802 and operation 806 may be performed simultaneously.

In some embodiments, the acquisition module 602 may acquire the radar echo data acquired by the one or more radars in real time. Exemplary radars may include a continuous wave (CW) radar, an ultra-wideband (UWB) radar, or a frequency modulated continuous wave (FMCW) radar, and so on. The one or more radars may be installed at suitable positions on or in the vicinity of the medical device in order to capture radar echo signals indicative of the physiological motion (i.e., the second motion) of the subject. In some embodiments, the captured radar echo data may be stored in a storage device (e.g., the storage device 130 or the storage device 550). The acquisition module 602 may acquire the radar echo data from the storage device 130. In some embodiments, the one or more radars may detect both the physiological motion and the rigid motion if there exists the rigid motion during the scan. In this case, if the radar echo data without a correction is used to determine physiological motion related data directly, the determined physiological motion related data may be inaccurate because the radar echo data includes disturbed information caused by the rigid motion.

In 808, the processing device (e.g., the second data determination module 606 of the processing device) may correct the radar echo data according to the one or more motion parameters of the first motion (e.g., the rigid motion).

The determined one or more motion parameters, based on Equation (1) and Equation (2), correspond to the camera coordinate system. To correct the radar echo data, the one or more motion parameters in the camera coordinate system may be transformed into the radar coordinate system. In some embodiments, system calibration between the camera coordinate system and the radar coordinate system may be performed.

Figure 9:
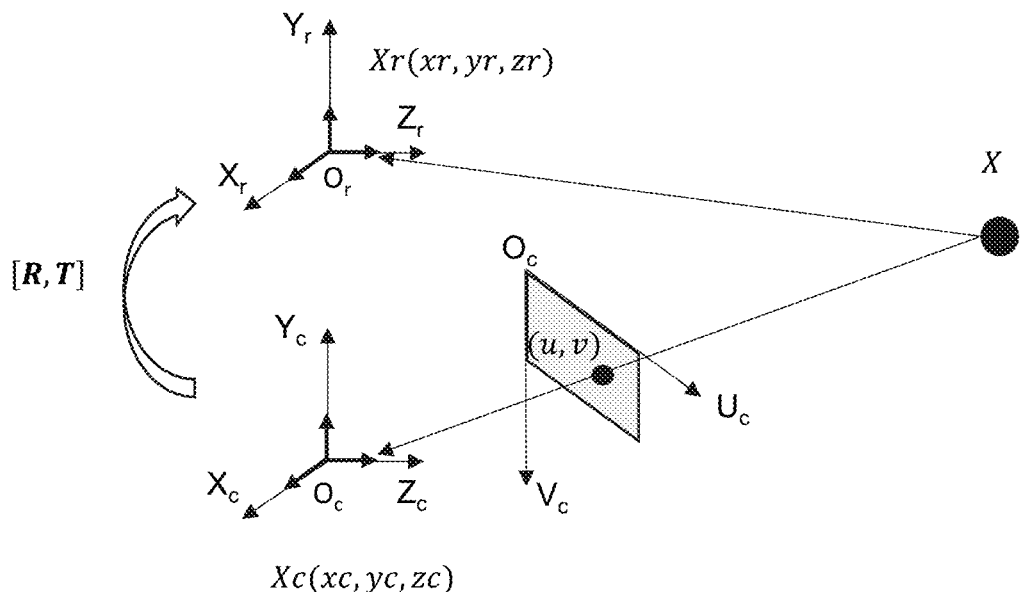
FIG. 9 is a schematic diagram illustrating an exemplary system calibrating according to some embodiments of the present disclosure.

Merely by way of example, FIG. 9 illustrates an exemplary system calibration between the camera coordinate system and the radar coordinate systems according to some embodiments of the present disclosure. As shown in FIG. 9, let $O_c X_c Y_c Z_c$ be the camera coordinate system, and let $O_r X_r Y_r Z_r$ be the radar coordinate system. The system calibration may be described by Equation (3) as follows:

$$X_r = R_{cr} X_c + T_{cr}, \tag{3}$$

where $X_r$ denotes the coordinates in the radar coordinate system, $X_c$ denotes the coordinates in the camera coordinate system, $R_{cr}$ denotes the rotation matrix between the camera coordinate system and the radar coordinate system, and $T_{cr}$ denotes the translation matrix between the camera coordinate system and the radar coordinate system. In some embodiments, the second data determination module 606 may determine one or more motion parameters corresponding to the radar coordinates system (also referred to as second motion parameters) based on the one or more motion parameters corresponding to the camera coordinate system (also referred to as first motion parameters). The second motion parameters may include the rotation matrix $R_r$ and the translation matrix $T_r$ in the radar coordinate system. In some embodiments, because the second motion parameters and the radar echo data are in the same coordinate system, the second data determination module 606 may correct the radar echo data based on the second motion parameters. For example, the second data determined module 606 may determine disturbed information corresponding to the second motion parameters, and correct the radar echo data by filtering out the disturbed information.

Assuming that $X_{r0}$ denotes the coordinates of a tracking marker in the radar coordinate system at $t_0$, and $X_{r1}$ denotes the coordinates of the tracking marker in the radar coordinate system at $t_1$. Thus, $$X_{r0} = R_{cr} X_{c0} + T_{cr}, \quad (4) \text{ and}$$

$$X_{r1} = R_{cr} X_{c1} + T_{cr}. \quad (5)$$

In some embodiments, $X_{r1}$ may be described by combining Equation (1) and Equation (4):

$$X_{r1} = R_{cr} R_c R_{cr}^{-1} X_{r0} - R_{cr} R_c R_{cr}^{-1} T_{cr} + R_{cr} T_c + T_{cr} = R_r X_{r0} + T_r. \quad (6)$$

In some embodiments, the second data determination module 606 may determine the rotation matrix $R_r$ and the translation matrix $T_r$ in the radar coordinate system based on Equation (6). For example, $$R_r = R_{cr} R_c R_{cr}^{-1}, \text{ and } T_{cr} = -R_{cr} R_c R_{cr}^{-1} T_{cr} + R_{cr} T_c + T_{cr}. \quad (7)$$

In 810, the processing device (e.g., the second data determination module 606 of the processing device) may extract, from the corrected radar echo data, the second data including cardiac motion data and/or respiratory motion data.

In some embodiments, the second data may refer to data related to the second motion (e.g., the physiological motion). The second data may include cardiac motion data (e.g., an ECG signal) and respiratory motion data. Specifically, the second data determination module 606 may extract, from the corrected radar echo data, the cardiac motion data, and the respiratory motion data, respectively. For example, the second data determination module 606 may perform an oblique removal operation for the corrected radar echo data. The oblique removal operation may include: it mixes an input signal with a reference signal (a local oscillator signal with appropriate delay, the delay is usually estimated from the result of narrowband signal ranging); then each scattering point corresponds to a single frequency component after mixing, and a discrete Fourier transformation (DFT) is performed for the mixed-frequency output signal. The second data determination module 606 may filter the radar echo data after the oblique removal. The filtered radar echo data may be amplified by an amplifier. The amplified radar echo data may be divided into the cardiac motion data and respiratory motion data by a signal separator (e.g., a demultiplexer). In some embodiments, the cardiac motion data and the respiratory motion data may be sent to the medical device for real time controlling the medical device.

Figure 10:
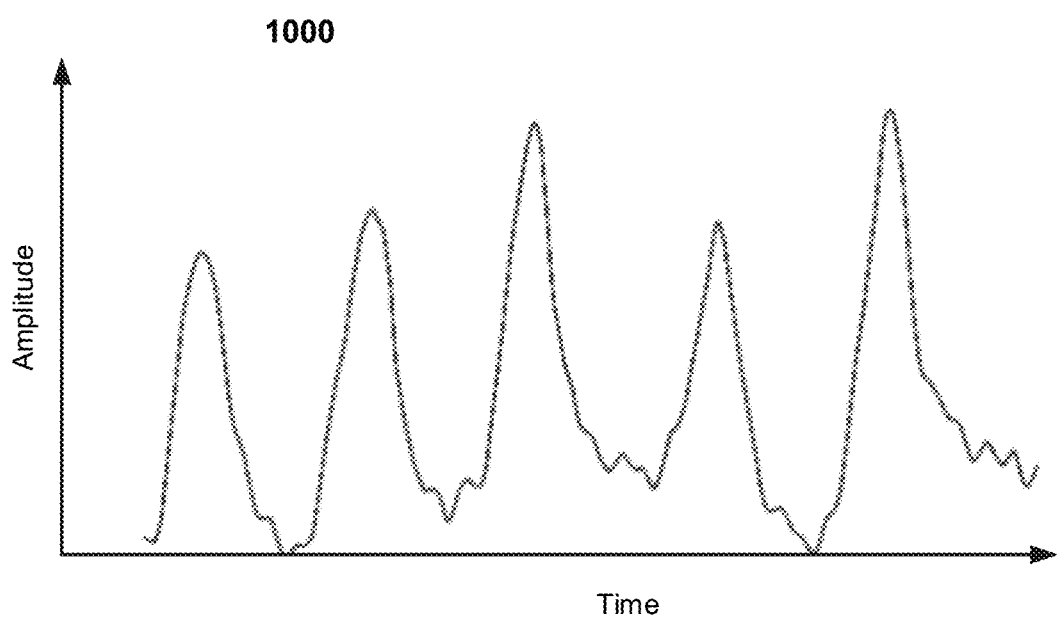
FIG. 10 is a schematic diagram illustrating an exemplary respiratory signal according to some embodiments of the present disclosure.
Figure 11:
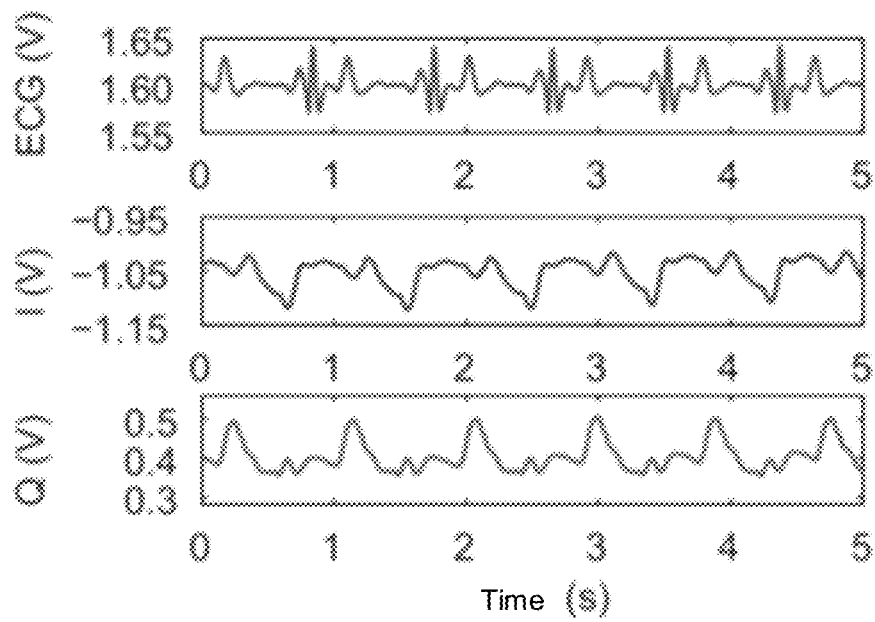
FIG. 11 is a schematic diagram illustrating an exemplary ECG signal according to some embodiments of the present disclosure.

Merely by way of example, FIG. 10 illustrates an exemplary respiratory signal 1000, and FIG. 11 illustrates an exemplary ECG signal. FIG. 10 shows a respiratory signal 1000 extracted from the radar echo signal after the rigid motion correction. The respiratory signal may include a respiratory waveform. The respiratory waveform may include a plurality of respiratory cycles. FIG. 11 shows an ECG signal extracted from the radar echo data after the rigid motion correction. The ECG signal may be extracted based on the Q channel and I channel of the radar echo signal. Q channel and I channel are two orthogonal channels of the radar.

Figure 12:
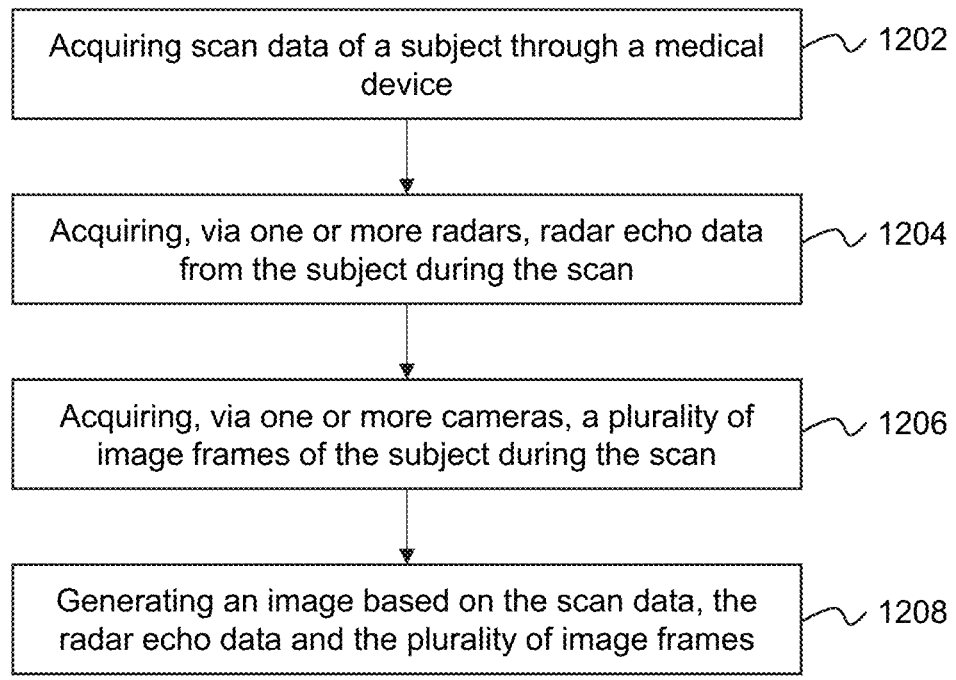
FIG. 12 is a flowchart illustrating an exemplary process for generating an image according to some embodiments of the present disclosure.

FIG. 12 is a flowchart illustrating an exemplary process for generating an image according to some embodiments of the present disclosure. Process 1200 may be implemented in the medical system 100 illustrated in FIG. 1 or the medical imaging system 500 illustrated in FIG. 5. For example, the process 1200 may be stored in the storage device 130 and/or the storage device 550 in the form of instructions (e.g., an application), and invoked and/or executed by the processing device 120 (e.g., the processing device 540 illustrated in FIG. 5, or one or more modules in the processing device 540 illustrated in FIG. 6). The operations of the illustrated process presented below are intended to be illustrative. In some embodiments, the process 1200 may be accomplished with one or more additional operations not described, and/or without one or more of the operations discussed. Additionally, the order in which the operations of the process 1200 as illustrated in FIG. 12 and described below is not intended to be limiting.

In 1202, the processing device (e.g., the acquisition module 602 of the processing device 540) may acquire scan data of a subject through a medical device. For example, during the medical device (e.g., an MRI device) scans the subject or at least a part of the subject, the acquisition module 602 may acquire the scan data related to the subject or the at least a part of the subject in real time or near real time. The acquired scan data may be stored in a storage device (e.g., the storage device 550).

In 1204, the processing device (e.g., the acquisition module 602 of the processing device 540) may acquire, via one or more radars, radar echo data from the subject during the scan. The radar echo data may be used to characterize a physiological motion (i.e., the second motion mentioned above) of the subject. In some embodiments, the one or more radars may be installed at suitable positions on or in the vicinity of the medical device in order to capture radar echo signals indicative of the physiological motion of the subject. In some embodiments, the radar echo data may be stored in a storage device (e.g., the storage device 550).

In 1206, the processing device (e.g., the acquisition module 602 of the processing device 540) may acquire, via one or more cameras, a plurality of image frames of the subject. The radar echo data may be used to characterize a rigid motion (i.e., the first motion mentioned above) of the subject. In some embodiments, the one or more cameras may be installed at suitable positions on or in the vicinity of the medical device in order to capture the plurality of image frames for identifying the rigid motion of the subject. In some embodiments, the plurality of image frames may be stored in a storage device (e.g., the storage device 550).

In 1208, the processing device (e.g., the reconstruction module 610 of the processing device 540) may generate an image based on the scan data, the radar echo data, and the plurality of image frames (operation 1008).

In some embodiments, the medical device may acquire the scan data continuously according to a retrospective gating technique. The reconstruction module 610 may obtain reconstruction data from the scan data based on the radar echo data and the plurality of image frames. However, in some embodiments, the one or more radars may detect both the physiological motion (i.e., the second motion) and the rigid motion (i.e., the first motion) if there exists the rigid motion during the scan. In this case, if the radar echo data without a correction is used to determine physiological motion related data directly, the determined physiological motion related data may be inaccurate because the radar echo data includes disturbed information caused by the rigid motion. To resolve this issue, the radar echo data may be corrected based on the plurality of image frames.

Specifically, the first data determination module 604 of the processing device 540 may determine, based on at least a part of the plurality of image frames, first data regarding the first motion (i.e., rigid motion related data). The first data may include one or more motion parameters of the rigid motion of the subject. The second data determination module 604 of the processing device 540 may correct the radar echo data according to the one or more motion parameters of the rigid motion. The second data determination module 604 may extract, from the corrected radar echo data, second data including cardiac motion data (e.g., the ECG signal illustrated in FIG. 11) and/or respiratory motion data (e.g., the ECG signal illustrated in FIG. 10). More detailed descriptions of first data and second data may be found elsewhere in the present disclosure, see, e.g., FIG. 8 and the descriptions thereof, and not repeated herein.

In some embodiments, the reconstruction module 610 may obtain the reconstruction data from the scan data based on the cardiac motion data or the respiratory data. For example, the reconstruction module 610 may obtain scan data corresponding to one or more specific cardiac cycles. The one or more specific cardiac cycles may be identified based on the cardiac motion data (e.g., the ECG signal). The scan data corresponding to the specific cardiac cycles may be designated as the reconstruction data. The reconstruction module 610 may reconstruct the image based on the designated reconstruction data. As another example, the reconstruction module 610 may obtain scan data corresponding to one or more specific respiratory cycles (e.g., one or more expiration periods). The one or more specific respiratory cycles may be identified based on the respiratory motion data (e.g., the respiratory signal). The scan data corresponding to the specific respiratory cycles may be designated as the reconstruction data. The reconstruction module 610 may reconstruct the image based on the designated reconstruction data. It should be understood that the fuse of the radar echo data and the image frames may be assisted to determine accurate cardiac motion data and respiratory motion data. The accurate cardiac motion data and respiratory motion data may facilitate to reduce or avoid motion artifacts (e.g., cardiac motion artifacts or respiratory motion artifacts) in the reconstructed image.

It should be noted that the description of the process 1200 is provided for the purposes of illustration, and not intended to limit the scope of the present disclosure. For persons having ordinary skills in the art, various variations and modifications may be conducted under the teaching of the present disclosure. For example, operations 1202 to 1206 may be integrated into a single operation, and/or be performed simultaneously. However, those variations and modifications may not depart from the protection of the present disclosure.

Figure 13:
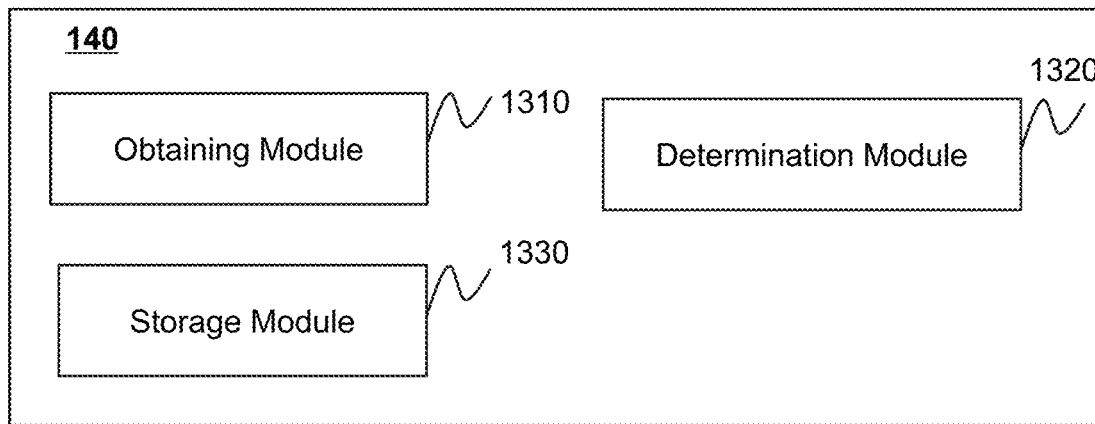
FIG. 13 is a block diagram illustrating an exemplary processing device according to some embodiments of the present disclosure.

FIG. 13 is a block diagram illustrating an exemplary processing device 120 according to some embodiments of the present disclosure. The processing device 120 may include an obtaining module 1310, a determination module 1320, and a storage module 1330.

The obtaining module 1310 may be configured to obtain scan data of a subject. The scan data of the subject may be acquired by an MR scanner at a time according to a pulse sequence. The pulse sequence may define one or more phase encoding gradients.

The obtaining module 1310 may be also configured to obtain motion data of the subject. The motion data may reflect a motion state of the subject at the time. The motion state may be defined by one or more motion parameters (e.g., a position, a velocity, a direction, a displacement, a motion acceleration, or the like, or any combination thereof) of the subject at the time.

The determination module 1320 may be configured to determine, based on the motion data of the subject, a processing strategy indicating whether using the scan data to fill one or more k-space lines corresponding to the pulse sequence in a k-space. The processing strategy may indicate how to process the scan data for the filling of the k-space. The processing strategy may include retaining the scan data, correcting the scan data based on the motion data, removing the scan data, replacing the scan data, etc. Before the scan data is used to fill the one or more k-space lines (e.g., phase-encoding lines, radial lines) corresponding to the pulse sequence in the k-space, the determination module 1320 may determine whether using the scan data to fill the one or more k-space lines corresponding to the pulse sequence in the k-space. In some embodiments, the determination module 1320 may determine how to use the scan data to fill the k-space if the determination module 1320 determines that the scan data may be used to fill the k-space. In some embodiments, the determination module 1320 may determine, based on the motion data of the subject, whether using the scan data to fill the one or more k-space lines corresponding to the pulse sequence in the k-space and how to use the scan data to fill the k-space.

The obtaining module 1310 may be further configured to obtain k-space data based on the processing strategy. In some embodiments, in response to determining, based on the motion data, that the motion state of the subject satisfies a first condition and does not satisfy a second condition, the obtaining module 1310 may correct the scan data based on the motion data to obtain corrected scan data, and obtain the k-space data by filling the one or more k-space lines in the k-space corresponding to the phase encoding gradients defined by the pulse sequence using the corrected scan data. In some embodiments, in response to determining, based on the motion data, that the motion state of the subject satisfies the first condition and satisfies the second condition, the obtaining module 1310 may retain the scan data, and further obtain the k-space data by filling the one or more k-space lines in the k-space corresponding to the phase encoding gradients defined by the pulse sequence using the scan data. In response to determining, based on the motion data, that the motion state of the subject does not satisfy the first condition and the scan data satisfies the third condition, the obtaining module 1310 may obtain second scan data of the subject acquired under the pulse sequence and replace the scan data using the second scan data. In some embodiments, the second scan data may be acquired by the MR scanner at the next time according to the pulse sequence. In some embodiments, in response to determining, based on the motion data, that the motion state of the subject does not satisfy the first condition and the scan data does not satisfy the third condition, the obtaining module 1310 may remove the scan data and the one or more k-space lines corresponding to the pulse sequence may be not filled. In some embodiments, the obtaining module 1310 may obtain second scan data of the subject. The second scan data may be acquired by the MR scanner at the next time according to a second pulse sequence.

The storage module 1330 may be configured to store data generated by the obtaining module 1310 and the determination module 1320. For example, the storage module 1330 may store the scan data, the motion data, the processing strategy, the plurality of conditions, etc.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the processing device 120 may include one or more additional modules and/or one or more modules described above may be omitted. Additionally or alternatively, two or more modules may be integrated into a single module and/or a module may be divided into two or more units. However, those variations and modifications also fall within the scope of the present disclosure.

Figure 14:
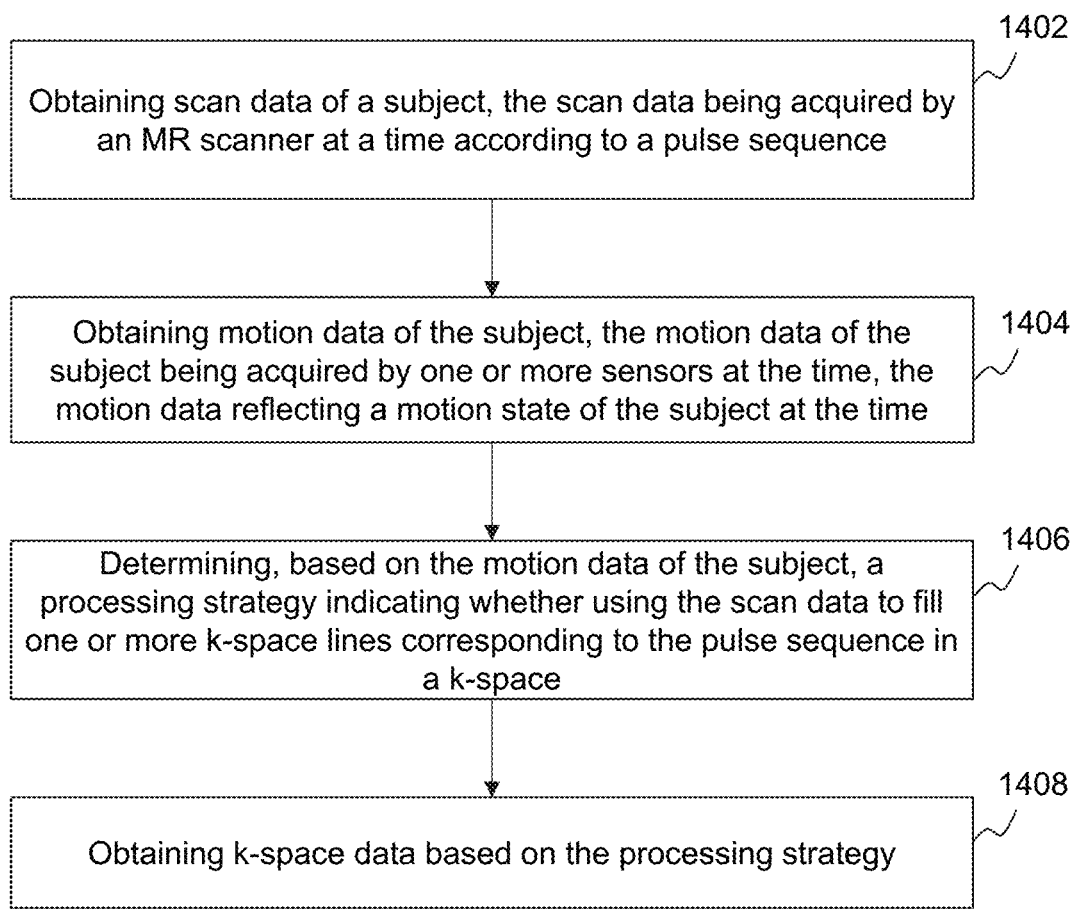
FIG. 14 is a flowchart illustrating an exemplary process for obtaining k-space data according to some embodiments of the present disclosure.

FIG. 14 is a flowchart illustrating an exemplary process for obtaining k-space data according to some embodiments of the present disclosure. In some embodiments, process 1400 may be executed by the medical system 100. For example, the process 1400 may be implemented as a set of instructions (e.g., an application) stored in a storage device (e.g., the storage device 130, the storage device 550). In some embodiments, the processing device 120 (e.g., the processor 540 of the medical imaging system 500 and/or one or more modules illustrated in FIG. 13) may execute the set of instructions and accordingly direct one or more components of the medical system 100 to perform the process 1400. In some embodiments, operation 710 may be performed according to process 1400.

In 1402, the processing device 120 (e.g., the obtaining module 1310) may obtain scan data of a subject.

The subject may be a patient, a portion of a patient, or any organism that needs to be imaged by an MR scanner (e.g., the MR scanner 110-1). In some embodiments, the subject may include a specific portion of a body, such as a head, a thorax, an abdomen, a leg, or the like, or any combination thereof. In some embodiments, the subject may include a specific organ, such as a breast, the heart, a lung, the stomach, the gallbladder, the small intestine, the colon, etc.

The scan data of the subject may be acquired by the MR scanner at a time according to a pulse sequence. The time may be a time point (e.g., a time when an MR signal is generated) or a time period (e.g., a time range when the pulse sequence is performed for once) in the scanning of the subject. The pulse sequence may define one or more phase encoding gradients. The pulse sequence defining a phase encoding gradient refers to that the pulse sequence defines parameters (e.g., an intensity and a direction) of the phase encoding gradient. It should be noted that the intensity of a phase encoding gradient corresponding to a pulse sequence may change along a frequency encoding direction (e.g., the Gx direction as described in FIG. 1 or Kx direction in a k-space) and the intensity of the phase encoding gradient may refer to a maximum intensity of the phase encoding gradient. Each of the one or more phase encoding gradients may correspond to a k-space line in a k-space and different k-space lines may correspond to different phase encoding gradients. In other words, a k-space line in the k-space may be defined by a phase encoding gradient with a specific direction and a specific intensity. In some embodiments, the one or more phase encoding gradients defined by the pulse sequence may be different. For example, the one or more phase encoding gradients defined by the pulse sequence may have the same direction and different maximum intensities. As another example, the one or more phase encoding gradients defined by the pulse sequence may have different directions and different maximum intensities. As still another example, the one or more phase encoding gradients defined by the pulse sequence may have different directions and the same maximum intensity.

In some embodiments, the scan data may include one or more MR signals (e.g., echo signals) that are generated (or encoded) under the pulse sequence. In some embodiments, the scan data may include one or more processed MR signals that are generated by performing one or more transform operations on the one or more MR signals. Exemplary transform operations may include a discrete Fourier transform (DFT), an analog-to-digital transform, a sampling operation, a discrete wavelet transform (DWT), or the like, or any combination thereof.

Each of the MR signals may correspond to one of the one or more phase encoding gradients defined by the pulse sequence. In other words, an MR signal corresponding to a phase encoding gradient may refer to that the MR signal is generated or encoded under the phase encoding gradient with a direction and an intensity. An MR signal corresponding to a phase encoding gradient may be used to fill a k-space line corresponding to the phase encoding gradient when one or more conditions (e.g., the second condition as described elsewhere in the present disclosure) are satisfied.

In some embodiments, the pulse sequence may be a certain pulse sequence included in an MR sequence corresponding to a certain time. The MR sequence may be used to scan the object and/or generate MR image data. Multiple pulse sequences may be arranged in the MR sequence, and when the subject is scanned, each of the multiple pulse sequences may be performed according to the arrangement of the multiple pulse sequences. In some embodiments, the MR sequence may include or be associated with one or more parameters (e.g., a radio-frequency (RF) pulse, a gradient field, data acquisition time, etc.) and an arrangement of pulse sequences in the MR sequence. For example, different MR sequences may have different arrangements of pulse sequences and be used to acquire information relating to different quantitative parameters (e.g., T1, T2, etc.) of the subject. Exemplary MR sequences may include a spin-echo (SE) sequence, an inversion recovery (IR) sequence, a gradient echo (GRE) sequence, an echo-planar imaging (EPI), a fast spin-echo (FSE) sequence, a fluid-attenuated inversion recovery (FLAIR) sequence, or the like, or a combination thereof. In some embodiments, the MR sequence may be determined according to a scanning protocol. The scanning protocol may include one or more MR sequences and scanning parameters. In some embodiments, the scanning protocol may be obtained from the storage device 130 or an external data source. In some embodiments, the scanning protocol may be provided by a user (e.g., a doctor, a technician, a physician, an engineer, etc.). In some embodiments, the scanning protocol may be generated automatically, for example, according to a default setting of the MR scanner, a machine learning model.

In some embodiments, the scan data of the subject may be acquired by the MR scanner and stored in a storage device (e.g., the storage device 130, the storage device 550, or an external database) at the time. The processing device 120 may retrieve the scan data of the subject from the storage device. In some embodiments, the processing device 120 may obtain the scan data of the subject directly from the MR scanner after the scan data of the subject is acquired at the time.

In 1404, the processing device 120 (e.g., the obtaining module 1310) may obtain motion data of the subject.

The motion data may reflect a motion state of the subject at the time. The motion state may be defined by one or more motion parameters (e.g., a position, a motion amplitude, a posture, a velocity, a direction, a displacement, a motion acceleration, or the like, or any combination thereof) of the subject at the time. In some embodiments, the motion state may include a static situation and a moving situation. The situation state refers to a state that the subject is still or substantially still at the time relative to a previous time. That is, the one or more parameters of the subject may not change at the time relative to the previous time. The previous time may refer to a time point or a time period when previous scan data (e.g., a previous MR signal, or a time when a previous pulse sequence is performed) is acquired or the time point when the scanning of the subject starts. Taking the abdomen as an example, when the subject stops moving and holds the breath, the motion state of the subject may be in a static situation. The moving situation refers to a state that the subject is moving at the time relative to the previous time. That is, the one or more parameters of the subject may change at the time relative to a previous time.

In some embodiments, the subject may move periodically, and the periodic motion of the subject may also be referred to as a regular motion. In some embodiments, the subject may move aperiodically, and the aperiodic motion may also be referred to as an irregular motion. In some embodiments, the regular motion may include a physiological motion (also referred to as the second motion or internal motion) of the subject, such as a respiratory motion, a heart motion, etc. In some embodiments, the irregular motion may include a rigid motion (also referred to as the first motion or a surface motion) of the subject, such as a translational and/or rotational motion of the subject. For example, the irregular motion may include a pose motion of the subject, such as the rotating or nodding of the head of the subject, a motion of a leg, a motion of a hand, or the like, or a combination thereof.

In some embodiments, the motion data of the subject may be acquired by one or more sensors at the time. The one or more sensors may include a radar sensor (e.g., a millimeter-wave radar), a camera, an optical sensor, a ranging device, a time-of-flight (TOF) device, a structured light scanner, an abdominal band, a contactless sensing device, a vital sign data acquisition device, or the like, or any combination thereof. In some embodiments, at least one of the one or more sensors may have a spatial resolution configured to distinguish the subject from other objects around the subject. In some embodiments, the spatial resolution of at least one sensor may be less than a resolution threshold, such that the subject may be distinguished from other objects around the subject by the sensor. The resolution threshold may be 1 millimeter, 5 millimeters, 10 millimeters, 50 millimeters, etc. For example, the spatial resolution of the camera may be less than 1 millimeter. As another example, the spatial resolution of the radar may be less than 5 millimeters. In some embodiments, a sensor having a higher spatial resolution may distinguish a slighter motion, thereby improving the accuracy of the motion state of the subject at the time. More descriptions for the one or more sensors may be found elsewhere in the present disclosure (e.g., FIGS. 1-5 and the descriptions thereof).

In some embodiments, the motion data may be sensor data directly acquired by the one or more sensors at the time. In some embodiments, the motion data of the internal motion of the subject may be directly acquired by the one or more sensors. For example, the motion data of the cardiac motion (e.g., an electrocardiograph (ECG) signal) may be obtained by a vital sign data acquisition device based on the ECG signal. In some embodiments, the motion data of the surface motion of the subject may be directly acquired by the one or more sensors. For example, the one or more sensors may include an abdominal band. The abdominal band may be worn (e.g., before the subject is scanned) on the abdomen of the subject to collect sensor data (e.g., a displacement, a direction) of the abdomen, and the collected sensor data may be directly used as the motion data. As another example, the one or more sensors may include a radar sensor. The radar sensor may directly acquire the motion data of the surface motion of the subject. In some embodiments, the motion data may be determined based on the sensor data acquired by the one or more sensors at the time. In some embodiments, the motion data of the internal motion of the subject may be determined based on the sensor data acquired by the one or more sensors. As shown in FIG. 10, the motion data of respiratory movement (i.e., the respiratory signal 1000) may be extracted from the sensor data (i.e., the radar echo signal) acquired by radar. As another example, as shown in FIG. 11, the motion data of heart movement (i.e., the ECG signal) may be extracted from the sensor data (i.e., the Q channel and I channel of the radar echo signal) acquired by radar. In some embodiments, the motion data of the surface motion of the subject may be determined based on the sensor data acquired by the one or more sensors. For example, the one or more sensors may include a camera. The motion data of the surface motion of the subject may be determined based on sensor data (e.g., one or more images, a video, etc.) acquired by the camera.

In some embodiments, the motion data may indicate rigid motion information of the subject. In some embodiments, the processing device 120 may determine first data regarding a first motion of the subject by processing a plurality of image frames acquired by one or more cameras. The processing device 120 may obtain radar echo data acquired by one or more radars. The processing device 120 may correct the radar echo data based on the first data. The processing device 120 may determine second data regarding a second motion of the subject by processing the corrected radar echo data. In some embodiments, the first motion may include the rigid motion of the subject, and the second motion may include the physiological motion. The processing device 120 may extract the rigid motion information (i.e., the motion data) based on the second data.

In some embodiments, the motion data may indicate physiological motion information of the subject. In some embodiments, the processing device 120 may determine first data regarding a first motion of the subject by processing a plurality of image frames acquired by one or more cameras. The processing device 120 may determine second data regarding a second motion of the subject determined by processing radar echo data acquired by one or more radars. The radar echo data may be corrected based on the first data. In some embodiments, the first motion may include the rigid motion of the subject, and the second motion may include the physiological motion. The processing device 120 may extract the physiological motion information (i.e., the motion data) based on the first data and the second data. More descriptions for determining the physiological motion information based on the first data and the second data may be found elsewhere in the present disclosure (e.g., FIG. 7 and the descriptions thereof).

In some embodiments, before determining the motion data of the subject, the processing device 120 may identify the subject from the sensor data acquired by the sensors. For example, the processing device 120 may identify the subject from a video or one or more images acquired by a camera. The processing device 120 may identify the subject from the sensor data using an object detection algorithm.

In some embodiments, the motion data of the subject may be acquired by the one or more sensors and stored in a storage device (e.g., the storage device 130, the storage device 550, or an external database) at the time. The processing device 120 may retrieve the motion data of the subject from the storage device. In some embodiments, the processing device 120 may obtain the motion data of the subject directly from the one or more sensors at the time. In some embodiments, the processing device 120 may obtain the sensor data acquired by the one or more sensors and determine the motion data based on the sensor data.

In 1406, the processing device 120 (e.g., the determination module 1320) may determine, based on the motion data of the subject, a processing strategy indicating whether using the scan data to fill one or more k-space lines corresponding to the pulse sequence in a k-space.

In some embodiments, if the pulse sequence defines multiple phase encoding gradients, the scan data may include multiple MR signals, and the MR signals may correspond to multiple k-space lines in the k-space. In some embodiments, if the pulse sequence defines one single phase encoding gradient, the scan data may include one single MR signal, and the MR signal may correspond to one single k-space line in the k-space. In some embodiments, the processing strategy may indicate whether use the scan data to fill the k-space. Before the scan data is used to fill the one or more k-space lines (also referred to as phase-encoding lines, or k-space filling lines) corresponding to the pulse sequence in the k-space, the processing device 120 may determine whether using the scan data to fill the one or more k-space lines corresponding to the pulse sequence in the k-space. In some embodiments, the processing strategy may indicate how to use the scan data to fill the k-space. In some embodiments, how to use the scan data to fill the k-space may include whether the scan data needs to be corrected. In some embodiments, the processing device 120 may determine how to use the scan data to fill the k-space if the processing device 120 determines that the scan data may be used to fill the k-space.

In some embodiments, the processing strategy may indicate how to process the scan data for the filling of the k-space. The processing strategy may include retaining the scan data, correcting the scan data based on the motion data, removing the scan data, replacing the scan data, etc. As used herein, retaining the scan data may refer to keeping the scan data for filling the one or more k-space lines in the k-space corresponding to the pulse sequence; correcting the scan data may refer to correcting the scan data to obtain corrected scan data for filling the one or more k-space lines in the k-space corresponding to the pulse sequence; removing the scan data may refer to not filling the one or more k-space lines in the k-space corresponding to the pulse sequence; replacing the scan data may refer to using new scan data for filling the one or more k-space lines in the k-space corresponding to the pulse sequence k-space. In some embodiments, removing the scan data may include removing the scan data from a storage device as described elsewhere in the present disclosure. In some embodiments, removing the scan data may include removing the scan data from the one or more k-space lines if the scan data has been filled to the k-space. In some embodiments, removing the scan data may indicate that the scan data is not available for the k-space lines corresponding to the scan data and the k-space lines may be not filled with any scan data. More descriptions regarding the determination of the processing strategy may be found elsewhere in the present disclosure (e.g., operation 1408 and the description thereof).

In 1408, the processing device 120 (e.g., the obtaining module 1310) may obtain k-space data based on the processing strategy.

In some embodiments, in response to determining, based on the motion data, that the motion state of the subject satisfies a first condition and does not satisfy a second condition, the processing device 120 may correct the scan data based on the motion data to obtain corrected scan data. In some embodiments, the processing device 120 may further obtain the k-space data by filling the one or more k-space lines in the k-space corresponding to the phase encoding gradients defined by the pulse sequence using the corrected scan data.

The first condition may include that a variation (i.e., degree of change) of the motion state at the time relative to a previous time (e.g., a time when the scanning of the subject starts) is less than a first threshold. The processing device 120 may determine that the first condition is satisfied by determining that the variation of the motion state at the time relative to the previous time is less than the first threshold. In some embodiments, the variation of the motion state at the time relative to the previous time less than the first threshold may include that a variation of each of the one or more motion parameters of the subject at the time relative to a previous time is less than the first threshold. In some embodiments, the variation of the motion state at the time relative to the previous time less than the first threshold may include that a variation of the weighted sum of the one or more motion parameters of the subject at the time relative to a previous time is less than the first threshold. In some embodiments, the motion state of the subject may be denoted as a motion vector that includes the one or more motion parameters. The variation of the motion state at the time relative to the previous time less than the first threshold may include that a difference of the motion vectors at the time and a previous time is less than the first threshold. The difference between the motion vectors at the time and the previous time may be determined based on a distance between the motion vectors at the time and the previous time. In some embodiments, the motion vector at the previous time may include a zero vector, and the difference of the motion vectors of the subject at the time and the previous time may be determined based on the length of the motion vector of the subject at the time.

The first threshold may be a value indicating that the variation of the motion state of the subject at the time has a certain degree of effect on the acquired scan data and the effect can be removed or eliminated by correcting the scan data. In some embodiments, the first threshold may be provided by a user of the medical system 100. Additionally or alternatively, the first threshold may be generated automatically, for example, according to the default setting of the MR scanner, the spatial resolution of the one or more sensors, etc., or any combination thereof.

The second condition may include that the motion state of the subject at the time does not change or a variation of the motion state at the time relative to a previous time is less a second threshold. The processing device 120 may determine that the second condition is not satisfied by determining that the motion state of the subject at the time changes and the variation of the motion state at the time relative to a previous time exceeds or equals the second threshold. In some embodiments, the motion state of the subject at the time not change or the variation of the motion state at the time relative to the previous time less than the second threshold may include that each of the one or more motion parameters of the subject at the time do not change or a variation of each of the one or more motion parameters of the subject at the time relative to a previous time is less than the second threshold. In some embodiments, the motion state of the subject at the time not change or the variation of the motion state at the time relative to the previous time less than the second threshold may include that a weighted sum of the one or more motion parameters of the subject at the time does not change or a variation of the weighted sum of the one or more motion parameters of the subject at the time relative to a previous time is less than the second threshold. In some embodiments, the motion state of the subject may be denoted as a motion vector that includes the one or more motion parameters. The motion state of the subject at the time not change or the variation of the motion state at the time relative to the previous time less than the second threshold may include that the motion vector at the time does not change or a difference of the motion vectors at the time and a previous time is less than the second threshold.

The second threshold may be a value indicating that the variation of the motion state of the subject at the time has little or no effect on the acquired scan data. In some embodiments, the second threshold may be provided by a user of the medical system 100. Additionally or alternatively, the second threshold may be generated automatically, for example, according to a default setting of the MR scanner, the spatial resolution of the one or more sensors, etc., or any combination thereof. Therefore, when the motion state of the subject satisfies the first condition and does not satisfy the second condition, the processing device 120 may correct the scan data based on the motion data to obtain the corrected scan data.

In some embodiments, the processing device 120 may correct the scan data according to the motion data. For example, a motion function (e.g., a motion phase, a motion matrix, a motion field, etc.) may be generated according to the motion data. The motion function may be used to correct the scan data to obtain the corrected scan data. For instance, the motion data of the subject may indicate that the subject has moved one centimeter at the time relative to the previous time. A motion phase corresponding to the motion (one centimeter) of the subject may be generated. Subsequently, the scan data of the subject may be corrected by using the motion phase corresponding to the motion, for example, multiplying the scan data of the subject by the motion phase. In some embodiments, the processing device 120 may correct the scan data using a correction algorithm. Exemplary correction algorithms may include a spatial transformation algorithm, a sharding correction algorithm, a Gopfert algorithm, a gray interpolation algorithm, or the like, or any combination thereof. It should be noted that the above correction algorithms are merely provided for the purposes of illustration, and not intended to limit the scope of the present disclosure.

In some embodiments, in response to determining, based on the motion data, that the motion state of the subject satisfies the first condition and satisfies the second condition, the scan data may be directly used to fill the one or more k-space lines corresponding to the pulse sequence in the k-space. Therefore, the processing device 120 may retain the scan data, and further obtain the k-space data by filling the one or more k-space lines in the k-space corresponding to the phase encoding gradients defined by the pulse sequence using the scan data. In some embodiments, the processing device 120 may determine that the second condition is satisfied by determining that the motion state of the subject at the time does not change and the variation of the motion state at the time relative to a previous time is less than the second threshold.

In some embodiments, if the motion state of the subject does not satisfy the first condition, the motion state of the subject may not satisfy the second condition. The first threshold may be greater than the second threshold.

In some embodiments, in response to determining, based on the motion data, that the motion state of the subject does not satisfy the first condition, the processing device 120 may remove the scan data and the one or more k-space lines in the k-space corresponding to the pulse sequence may be not filled.

Figure 18A:
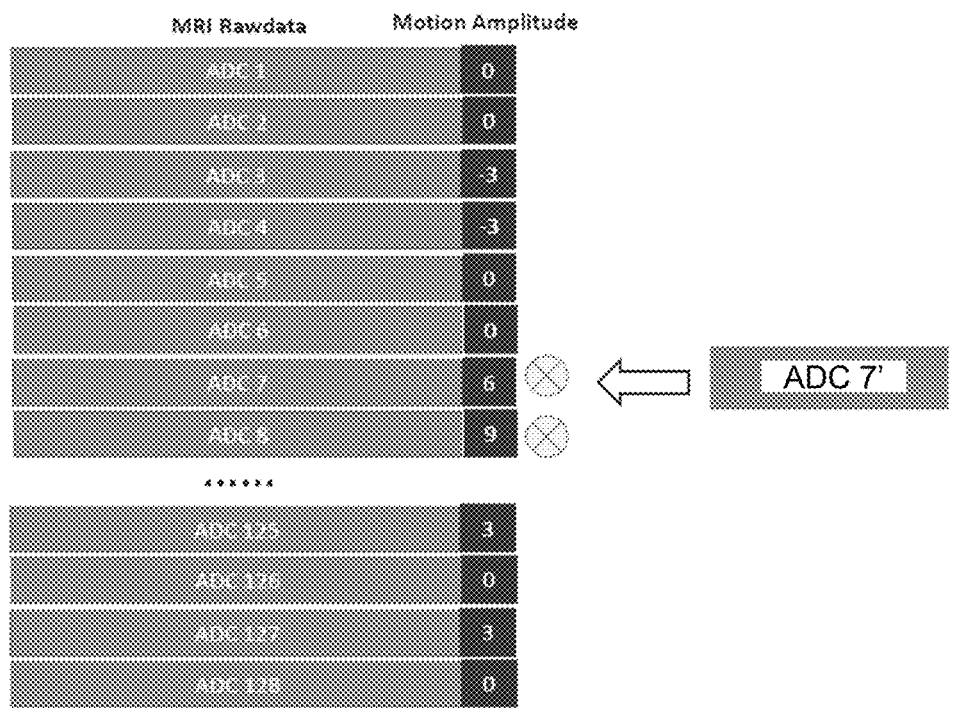
FIG. 18A is a schematic diagram illustrating exemplary processing strategies for scan data according to some embodiments of the present disclosure.

In some embodiments, in response to determining, based on the motion data, that the motion state of the subject does not satisfy the first condition, the processing device 120 may determine whether the scan data satisfies a third condition. The processing device 120 may determine that the first condition is not satisfied by determining that the variation of the motion state at the time relative to the previous time exceeds or equals the first threshold. For example, the variation of the motion state at the time relative to the previous time exceeding or equal to the first threshold may include that a variation of each of the one or more motion parameters of the subject at the time relative to a previous time is larger than or equal to the first threshold. As another example, the variation of the motion state at the time relative to the previous time larger than or equal to the first threshold may include that the variation of the weighted sum of the one or more motion parameters of the subject at the time relative to a previous time is larger than or equal to the first threshold. As a further example, the variation of the motion state at the time relative to the previous time larger than or equal to the first threshold may include that the difference of the motion vectors at the time and a previous time is larger than or equal to the first threshold. In response to determining, based on the motion data, that the motion state of the subject does not satisfy the first condition and the scan data satisfies the third condition, the processing device 120 may obtain second scan data of the subject acquired under the pulse sequence and replace the scan data using the second scan data. The second scan data may be assessed for filling the one or more k-space lines corresponding to the pulse sequence, i.e., the processing strategy of the second scan data may be determined for filling the one or more k-space lines corresponding to the pulse sequence. Referring to FIG. 18A, FIG. 18A is a schematic diagram illustrating an exemplary processing strategy according to some embodiments of the present disclosure. The motion amplitude of the subject at a time when MR signal ADC 7 is acquired is 7 relative to a previous time (e.g., the time when an MR signal ADC 1 is acquired). The motion amplitudes of the subject at a time when MR signals ADC 2-ADC 6 are acquired are 0, −3, −3, 0, 0, respectively relative to the previous time (e.g., the time when an MR signal ADC 1 is acquired). The vibrations of the motion amplitudes of the subject at a time when MR signals ADC 2-ADC 6 are acquired relative to the previous time are less than 4. The processing strategy for ADC 2-ADC 6 may include retaining ADC 2-ADC 6. The vibration of the motion amplitude of the subject at a time when MR signal ADC 7 is acquired relative to the previous time exceeds 4, i.e., the motion state corresponding to ADC 7 does not satisfy the first condition, but ADC 7 satisfies the third condition, the processing device 120 may replace the ADC 7 by ADC 7'. ADC 7' represents an MR signal acquired by using a pulse sequence for acquiring the MR signal corresponding to ADC 7.

The third condition may indicate that a contribution of the one or more k-space lines corresponding to the pulse sequence in the k-space to the image quality of a reconstructed MR image based on the k-space data. The image quality of the reconstructed MR image may include a contrast, a resolution, etc. For example, an MR signal acquired under a greater phase encoding gradient may have a smaller amplitude than an MR signal acquired under a smaller phase encoding gradient. The MR signals having greater amplitudes may define the contrast of the reconstructed MR image and the MR signals having smaller amplitudes may define the resolution of the reconstructed MR image. In some embodiments, the third condition may include that the amplitude of the scan data (e.g., an MR signal) exceeds a third threshold (e.g., an amplitude threshold) when the image quality of the reconstructed MR image is defined by the contrast. In some embodiments, the third condition may include that the maximum intensity of the phase encoding gradient corresponding to the scan data is less than the third threshold (e.g., an intensity threshold) when the image quality of the reconstructed MR image is defined by the contrast. In some embodiments, the third condition may include that the amplitude of the scan data is less than the third threshold (e.g., an amplitude threshold) when the image quality of the reconstructed MR image is defined by the resolution. In some embodiments, the third condition may include that the maximum intensity of the phase encoding gradient corresponding to the scan data exceeds the third threshold (e.g., an intensity threshold) when the image quality of the reconstructed MR image is defined by the resolution.

In some embodiments, the k-space lines in the k-space may correspond to phase encoding gradients that increase from a center region of the k-space to a boundary region of the k-space along the phase encoding direction (e.g., Ky direction in the k-space). The k-space lines in the center region of the k-space may be associated with the contrast of the reconstructed MR image and the k-space lines in the boundary region of the k-space may be associated with the resolution of the reconstructed MR image. In some embodiments, the third condition may include that the one or more k-space lines corresponding to the scan data (or the pulse sequence) are located in the center region of the k-space when the image quality of the reconstructed MR image is defined by the contrast. In some embodiments, the third condition may include that the one or more k-space lines corresponding to the scan data are located in the boundary region of the k-space when the image quality of the reconstructed MR image is defined by the resolution.

In some embodiments, each contribution of k-space lines in the k-space to the image quality may be assigned with a reference contribution value. The processing device 120 may obtain the contribution value of the scan data based on the k-space lines corresponding to the scan data and the reference contribution values. The third condition may include that the contribution value of the scan data exceeds the third threshold (e.g., a contribution value threshold). In some embodiments, the third threshold may be provided by the user. Additionally or alternatively, the third threshold may be generated automatically, for example, according to the MRI sequence.

In some embodiments, the second scan data may be acquired by the MR scanner at a next time according to the pulse sequence. For instance, when the motion state of the subject does not satisfy the first condition and the scan data satisfies the third condition, the second scan data may be acquired by the MR scanner at the next time according to the pulse sequence, and replaced the scan data by the second scan data. In some embodiments, the processing device 120 may further obtain second motion data of the subject. The second motion data of the subject may be acquired by the one or more sensors at the next time. The acquisition of the second motion data of the subject may be the same as the acquisition of the motion data of the subject as described in 1404. The second motion data may reflect a motion state of the subject at the next time. In some embodiments, the processing device 120 may determine, based on the second motion data of the subject, a second processing strategy associated with whether using the second scan data to fill the one or more k-space lines corresponding to the pulse sequence in the k-space. The determination of the second processing strategy may be the same as the determination of the processing strategy. In some embodiments, the processing device 120 may obtain the k-space data based on the second processing strategy.

Figure 18B:
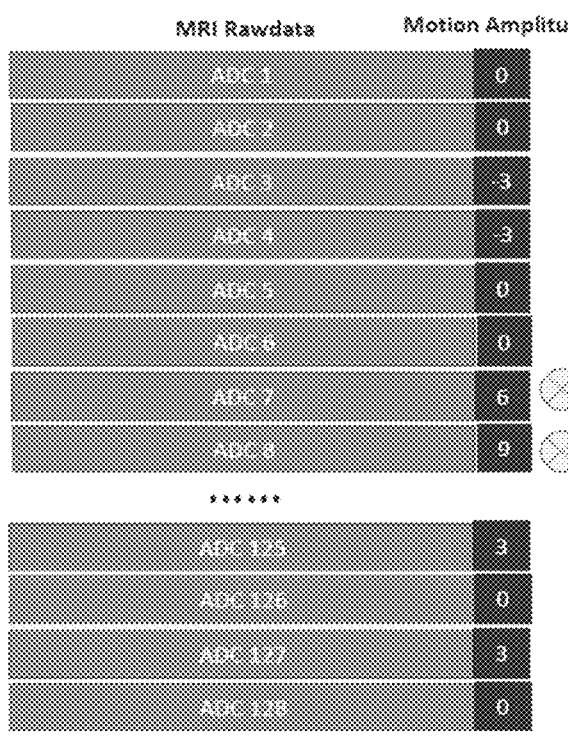
FIG. 18B is a schematic diagram illustrating exemplary processing strategies for scan data according to some embodiments of the present disclosure.

In some embodiments, in response to determining, based on the motion data, that the motion state of the subject does not satisfy the first condition and the scan data does not satisfy the third condition, the processing device 120 may remove the scan data and the one or more k-space lines corresponding to the pulse sequence may be not filled. In some embodiments, the scan data not satisfying the third condition may include that the contribution value of the scan data does not exceed the third threshold. In some embodiments, the scan data not satisfying the third condition may include that the amplitude of the scan data (e.g., an MR signal) does not exceed the third threshold (e.g., an amplitude threshold) when the image quality of the reconstructed MR image is defined by the contrast. As another example, the scan data not satisfying the third condition may include that the maximum intensity of the phase encoding gradient corresponding to the scan data is larger than or equal to the third threshold (e.g., an intensity threshold) when the image quality of the reconstructed MR image is defined by the contrast. As a further example, the scan data not satisfying the third condition may include that the amplitude of the scan data (e.g., an MR signal) is larger than or equal to the third threshold (e.g., an amplitude threshold) when the image quality of the reconstructed MR image is defined by the resolution. As a further example, the scan data not satisfying the third condition may include that the maximum intensity of the phase encoding gradient corresponding to the scan data does not exceed the third threshold (e.g., an intensity threshold) when the image quality of the reconstructed MR image is defined by the resolution. As a further example, the scan data not satisfying the third condition may include that the one or more k-space lines corresponding to the scan data are located in the boundary region of the k-space when the image quality of the reconstructed MR image is defined by the contrast. As a further example, the scan data not satisfying the third condition may include that the one or more k-space lines corresponding to the scan data are located in the center region of the k-space when the image quality of the reconstructed MR image is defined by the resolution. Referring to FIG. 18B, FIG. 18B is a schematic diagram illustrating an exemplary processing strategy according to some embodiments of the present disclosure. Scan data (e.g., ADC 7, ADC 8) does not satisfy the third condition, the processing device 120 may remove the scan data. In some embodiments, the processing device 120 may obtain second scan data of the subject. The second scan data may be acquired by the MR scanner at the next time according to a second pulse sequence. The second pulse sequence may be included in the MR sequence corresponding to the next time and different from the pulse sequence included in the MR sequence corresponding to the time. For example, the phase encoding gradient defined by the pulse sequence may be different from the phase encoding gradient defined by the second pulse sequence. The phase encoding gradient defined by the pulse sequence different from the phase encoding gradient defined by the second pulse sequence refers to the maximum intensity of the phase encoding gradient defined by the pulse sequence different from the maximum intensity of the phase encoding gradient defined by the second pulse sequence. In some embodiments, the processing device 120 may obtain the second motion data of the subject. The second motion data of the subject may be acquired by the one or more sensors at the next time. The acquisition of the second motion data of the subject may be the same as the acquisition of the motion data of the subject as described in 1404. The second motion data may reflect a motion state of the subject at the next time. In some embodiments, the processing device 120 may determine, based on the second motion data of the subject, a second processing strategy associated with whether using the second scan data to fill one or more k-space lines corresponding to the next pulse sequence in the k-space. The determination of the second processing strategy may be the same as the determination of the processing strategy. In some embodiments, the processing device 120 may obtain the k-space data based on the second processing strategy.

In some embodiments, the processing device 120 may determine the processing strategy of each scan data acquired at each time in real-time according to operations 1402-1408 during the scanning of the subject. In some embodiments, the processing device 120 may determine the processing strategy of each scan data acquired at each time according to operations 1402-1408 after the scanning of the subject is finished (e.g., one or more termination conditions are satisfied). More descriptions for termination conditions may be found elsewhere in the present disclosure (e.g., FIG. 15 and the descriptions thereof).

In some embodiments, the processing device 120 may reconstruct one or more intermediate MR images of the subject based on the k-space data acquired after each scan data is processed based on the processing strategy of the scan data. The processing device 120 may update the k-space after each scan data is acquired by the MR scanner and processed based on the processing strategy. The processing device 120 may update the one or more intermediate MR images of the subject based on the updated k-space data to obtain target MR images until the last scan data is acquired and processed based on the processing strategy of the last scan data.

In some embodiments, the processing device 120 may reconstruct the one or more target MR images of the subject based on the k-space data acquired after all the scan data are processed based on the processing strategies of all the scan data.

It should be noted that the above description regarding the process 1400 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 1400 may be accomplished with one or more additional operations not described and/or without one or more of the operations discussed above. For example, operation 1406 and operation 1408 may be combined into a single operation. As another example, one or more other optional operations (e.g., a storing operation) may be added elsewhere in the process 1400. In the storing operation, the processing device 120 may store information and/or data (e.g., the scan data, the motion data, the processing strategies, the first condition, the second condition, the third condition, etc.) associated with the medical system 100 in a storage device (e.g., the storage device 130) disclosed elsewhere in the present disclosure.

Figure 15:
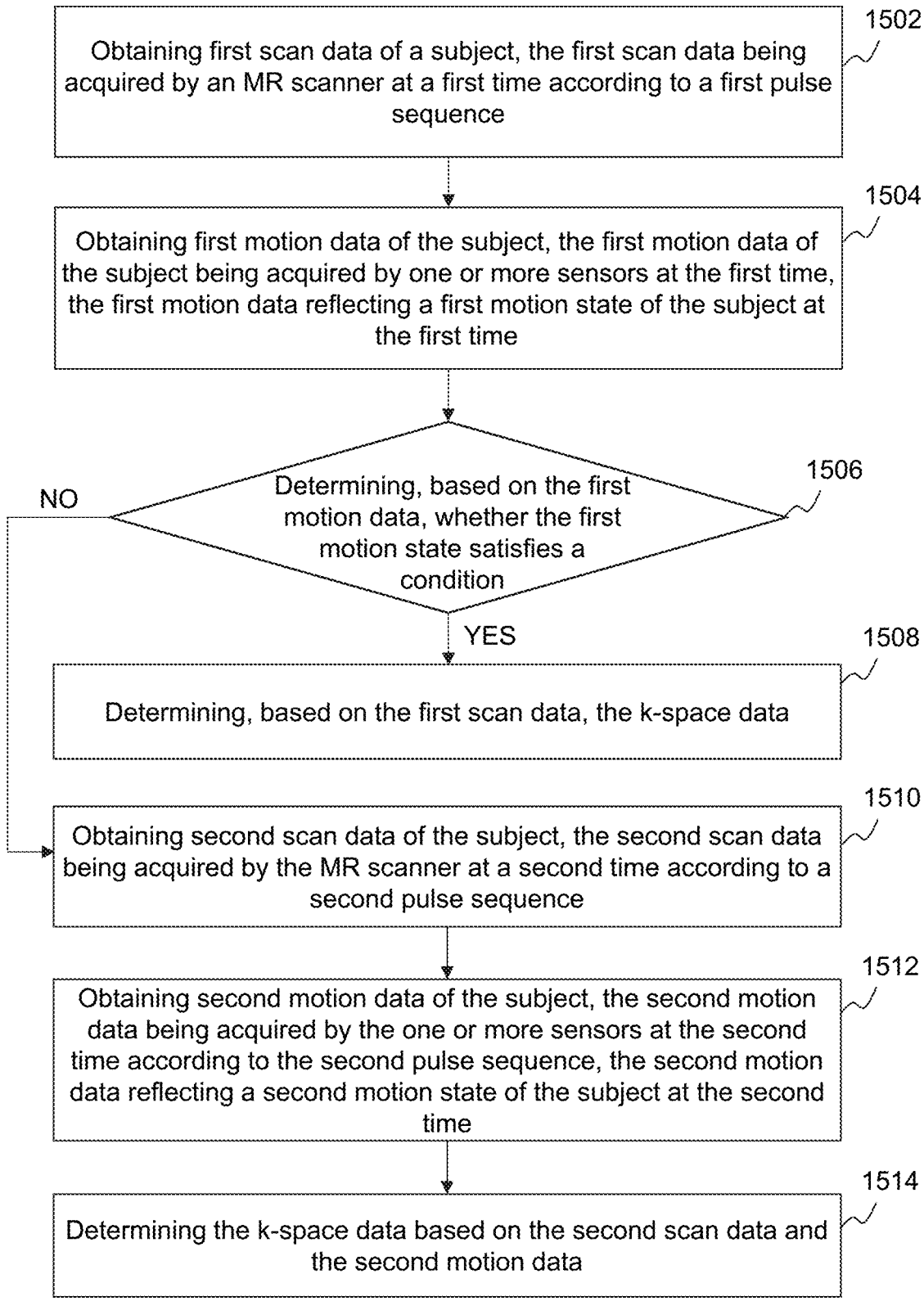
FIG. 15 is a flowchart illustrating an exemplary process for obtaining k-space data according to some embodiments of the present disclosure.

FIG. 15 is a flowchart illustrating an exemplary process for obtaining k-space data according to some embodiments of the present disclosure. In some embodiments, process 1500 may be executed by the medical system 100. For example, the process 1500 may be implemented as a set of instructions (e.g., an application) stored in a storage device (e.g., the storage device 130, the storage device 550). In some embodiments, the processing device 120 (e.g., the processor 540 of the medical imaging system 500 and/or one or more modules illustrated in FIG. 13) may execute the set of instructions and accordingly direct one or more components of the medical system 100 to perform the process 1500.

In 1502, the processing device 120 (e.g., the obtaining module 1310) may obtain first scan data of a subject.

The subject may be a patient, a portion of a patient, or any organism that needs to be imaged by an MR scanner (e.g., the MR scanner 110-1). More descriptions regarding the subject may be found elsewhere in the present disclosure (e.g., operation 1402 and the descriptions thereof).

The first time may be a time point or a time period during the scanning of the subject. The first time may be the current time for scanning the subject. The first scan data of the subject may be acquired by the MR scanner at the first time according to the first pulse sequence. The first pulse sequence may define one or more phase encoding gradients corresponding to the first time. More descriptions regarding obtaining the first scan data may be found elsewhere in the present disclosure (e.g., operation 1402 and the descriptions thereof).

In some embodiments, the processing device 120 may obtain the first scan data from the MR scanner in real time after the first scan data is acquired by the MR scanner.

In 1504, the processing device 120 (e.g., the obtaining module 1310) may obtain first motion data of the subject.

The first motion data may reflect a first motion state of the subject at the first time. The first motion state may be defined by one or more motion parameters (e.g., a position, a velocity, a direction, a displacement, a motion acceleration, or the like, or any combination thereof) of the subject at the first time.

In some embodiments, the subject may move periodically, and the periodic motion of the subject may also be referred to as a regular motion (e.g., the physiological motion). In some embodiments, the subject may move aperiodically, and the aperiodic motion may also be referred to as an irregular motion (e.g., the rigid motion). More descriptions regarding the first motion data may be found elsewhere in the present disclosure (e.g., operation 1404 and the descriptions thereof).

In some embodiments, the first motion data of the subject may be acquired by one or more sensors at the first time. The one or more sensors may include a radar sensor, a camera, an optical sensor, a ranging device, a time-of-flight (TOF) device, a structured light scanner, an abdominal band, a contactless sensing device, a vital sign data acquisition device, or the like, or any combination thereof. In some embodiments, at least one of the one or more sensors may have a spatial resolution configured to distinguish the subject from other objects around the subject. More descriptions for the one or more sensors may be found elsewhere in the present disclosure (e.g., FIGS. 1, 14, and the descriptions thereof).

In some embodiments, the first motion data may be sensor data directly acquired by the one or more sensors at first the time. In some embodiments, the first motion data may be determined based on the sensor data acquired by the one or more sensors at the first time. More descriptions regarding obtaining the first motion data may be found elsewhere in the present disclosure (e.g., operation 1404 and the descriptions thereof).

In some embodiments, the processing device 120 may obtain the first motion data from the one or more sensors in real-time after the first motion data is acquired by the one or more sensors.

In 1506, the processing device 120 (e.g., the obtaining module 1310) may determine, based on the first motion data, whether the first motion state satisfies a condition (also referred to as the first condition). In response to determining that the first motion state satisfies the first condition, the processing device 120 may perform operation 1508. In response to determining that the first motion state does not satisfy the first condition, the processing device 120 may proceed to perform operation 1510.

The first condition may include that a variation of the first motion state at the first time relative to a previous time is less than a first threshold. The previous time may refer to a time point or a time period when previous scan data (e.g., a previous MR signal) is acquired. In some embodiments, the variation of the first motion state at the first time relative to the previous time less than the first threshold may include that a variation of each of the one or more motion parameters of the subject at the first time relative to a previous time is less than the first threshold. More descriptions regarding the first condition may be found elsewhere in the present disclosure (e.g., operation 1408 and the descriptions thereof).

In 1508, in response to determining that the first motion state satisfies the first condition, the processing device 120 (e.g., the determination module 1320) may determine, based on the first scan data, the k-space data. As used herein, determining the k-space data refers to determining a portion of the k-space data that may be determined based on scan data acquired according to a pulse sequence. In other words, determining the k-space data refers to determining data corresponding to one or more k-space lines in the k-space corresponding to the pulse sequence.

In some embodiments, the processing device 120 may determine, based on the first scan data and whether the first motion state satisfies a second condition, the k-space data. The second condition may include that the first motion state of the subject at the first time does not change or a variation of the first motion state at the first time relative to a previous time is less a second threshold. More descriptions regarding the second condition may be found in elsewhere in the present disclosure (e.g., operation 1408 and the descriptions thereof). In some embodiments, if the motion state of the subject does not satisfy the first condition, the motion state of the subject may not satisfy the second condition. The first threshold may be greater than the second threshold.

In some embodiments, in response to determining that the first motion state satisfies the second condition, the processing device 120 may determine the k-space data (i.e., a portion of the k-space data used for reconstructing MR images of the subject) by filling one or more k-space lines in a k-space using the first scan data. The one or more k-space lines may correspond to one or more phase encoding gradients defined by the first pulse sequence. In some embodiments, if the first pulse sequence defines one single phase encoding gradient, the first scan data may include one single first MR signal, and the first MR signal may correspond to one single k-space line in the k-space. The processing device 120 may retain the first scan data, and further obtain the k-space data by filling the one or more k-space lines in the k-space corresponding to the phase encoding gradients defined by the first pulse sequence using the first scan data.

In some embodiments, in response to determining that the first motion state does not satisfy the second condition, the processing device 120 may obtain corrected first scan data by correcting the first scan data based on the first motion data. In some embodiments, the processing device 120 may correct the first scan data according to the first motion data. In some embodiments, the processing device 120 may correct the first scan data using a correction algorithm. More descriptions regarding the correction of the first scan data may be found elsewhere in the present disclosure (e.g., operation 1408 and the descriptions thereof). In some embodiments, the processing device 120 may further determine the k-space data by filling the k-space using the corrected first scan data. The one or more k-space lines may correspond to the first pulse sequence. In some embodiments, the processing device 120 may further obtain the k-space data by filling the one or more k-space lines in the k-space corresponding to the phase encoding gradients defined by the first pulse sequence using the corrected first scan data.

In 1510, in response to determining that the first motion state does not satisfy the first condition, the processing device 120 (e.g., the obtaining module 1310) may obtain second scan data of the subject. The second scan data may be acquired by the MR scanner at a second time according to a second pulse sequence. The second time may refer to a time point or a time period when the latter scan data (e.g., one or more latter MR signals) is acquired. In other words, the second time may be a time point or time period when a pulse sequence next to the first pulse sequence (i.e., the second pulse sequence, also referred to as a next pulse sequence) arranged in an MR sequence is performed.

In some embodiments, in response to determining, based on the first motion data, that the first motion state of the subject does not satisfy the first condition, the processing device 120 may remove the first scan data and the one or more k-space lines in the k-space corresponding to the first pulse sequence may be not filled.

In some embodiments, in response to determining, based on the first motion data, that the first motion state of the subject does not satisfy the first condition, the processing device 120 may determine whether the first scan data satisfies a third condition. The third condition may indicate that a contribution of the one or more k-space lines corresponding to the pulse sequence in the k-space to the image quality of a reconstructed MR image based on the k-space data. The image quality of the reconstructed MR image may include a contrast, a resolution, etc. In some embodiments, each contribution of k-space lines in the k-space to the image quality may be assigned with a reference contribution value. The processing device 120 may obtain the contribution value of the scan data based on the k-space lines corresponding to the scan data and the reference contribution values. The third condition may include that the contribution value of the scan data exceeds the third threshold. More descriptions regarding the third condition may be found elsewhere in the present disclosure (e.g., operation 1408 and the descriptions thereof). In some embodiments, the processing device 120 may further determine the second pulse sequence based on whether the first scan data satisfies the third condition.

In some embodiments, in response to determining that the first scan data satisfies the third condition, the processing device 120 may designate the first pulse sequence as the second pulse sequence. Subsequently, the second scan data may be acquired by the MR scanner according to the first pulse sequence at the second time. For instance, when the first motion state of the subject does not satisfy the first condition and the first scan data satisfies the third condition, the second scan data may be acquired by the MR scanner at the second time according to the first pulse sequence, and the first scan data may be replaced by the second scan data using the second scan data. The second scan data may be assessed to fill the one or more k-space lines corresponding to the first pulse sequence according to operations 1512 and 1514. In some embodiments, the processing device 120 may cause the MR scanner to perform the first pulse sequence again to obtain the second scan data. For example, the processing device 120 may modify the MR sequence by adding, after the first pulse sequence, the second pulse sequence that is the same as the first pulse sequence arranged.

In some embodiments, in response to determining that the first scan data does not satisfy the third condition, the processing device 120 may obtain the second pulse sequence different from the first pulse sequence from the MR sequence. The processing device 120 may cause the MR scanner to perform the second pulse sequence.

Subsequently, the second scan data may be acquired by the MR scanner at the second time according to the second pulse sequence. The second pulse sequence may be included in the MR sequence corresponding to the second time and different from the first pulse sequence included in the MR sequence corresponding to the first time. For example, the one or more phase encoding gradients defined by the first pulse sequence may be different from the one or more phase encoding gradients defined by the second pulse sequence. The second scan data may be used for filling one or more k-space lines corresponding to the second pulse sequence that is different from the one or more k-space lines corresponding to the first pulse sequence. The second scan data may be assessed according to operations 1512 and 1514 for filling the k-space.

In 1512, the processing device 120 (e.g., the obtaining module 1310) may obtain second motion data of the subject.

The second motion data may be acquired by the one or more sensors at the second time. The second motion data may reflect a second motion state of the subject at the second time. The acquisition of the second motion data of the subject may be the same as the acquisition of the motion data of the subject as described in 1404. More descriptions regarding obtaining the second motion data may be found elsewhere in the present disclosure (e.g., operation 1408 and the descriptions thereof).

In 1514, the processing device 120 (e.g., the obtaining module 1310) may determine the k-space data based on the second scan data and the second motion data.

In some embodiments, in response to determining that the first scan data satisfies the third condition, the processing device 120 may obtain the second scan data by causing the MR scanner to perform the first pulse sequence again at the second time and the processing device 120 may determine whether the second motion state satisfies the first condition. Determining whether the second motion state satisfies the first condition may be the same as determining whether the first motion state satisfies the first condition as described in 1506. In response to determining that the second motion state satisfies the first condition, the processing device 120 may determine the k-space data by filling the one or more k-space lines corresponding to the first pulse sequence in the k-space based on the second scan data. The second scan data may be assessed for filing the one or more k-space lines corresponding to the first pulse sequence. That is, the second scan data may be determined for filling the one or more k-space lines corresponding to the first pulse sequence. In some embodiments, in response to determining that the second motion state does not satisfy the first condition, the processing device 120 may continue to perform operation 1510 (i.e., cause the MR scanner to perform the first pulse sequence) until the first condition is satisfied. In some embodiments, in response to determining that the second motion state does not satisfy the first condition, the processing device 120 may remove the second scan data and cause the MR scanner to perform a new pulse sequence different from the first pulse sequence.

In some embodiments, in response to determining that the first scan data does not satisfy the third condition, the processing device 120 may obtain the second scan data by causing the MR scanner to perform a new pulse sequence different from the first pulse sequence at the second time and determine whether the second motion state satisfies the first condition. Determining whether the second motion state satisfies the first condition may be the same as determining whether the first motion state satisfies the first condition as described in 1506. In response to determining that the second motion state satisfies the first condition, the processing device 120 may determine the k-space data by filling one or more k-space lines corresponding to the second pulse sequence in the k-space based on the second scan data. In response to determining that the second motion state does not satisfy the first condition, the processing device 120 may continue to perform operation 1510.

In some embodiments, the processing device 120 may determine the k-space data from each scan data acquired at each time in real-time according to operations 1502-1514 during the scanning of the subject until one or more termination conditions are satisfied. The k-space data may be updated after each pulse sequence is performed and the each scan data is assessed if the scan data can be used to fill the k-space to obtain the updated k-space data for reconstructing one or more MR images until one or more termination conditions are satisfied.

In some embodiments, the processing device 120 may determine whether a termination condition is satisfied. In some embodiments, the termination condition may include that a count (or number) of k-space lines that have been filled in the k-space using scan data is larger than a fourth threshold. In some embodiments, the termination condition may include that all the pulse sequences in the MR sequence are performed. In some embodiments, the termination condition may include that an image reconstructed based on k-space lines that have been filled in the k-space satisfies a quality criterion.

In some embodiments, the processing device 120 may compare a count of the k-space lines that have been filled in the k-space using scan data with the fourth threshold. The fourth threshold may refer to a minimum count of the k-space lines that can be used to reconstruct an MR image with a certain quality. In some embodiments, the fourth threshold may be provided by a user of the medical system 100. Additionally or alternatively, the fourth threshold may be generated automatically, for example, according to the default setting of the MR scanner, the MR sequence, an MR reconstruction algorithm, etc., or any combination thereof. When the count of the k-space lines that have been filled is larger than the fourth threshold, the processing device 120 may determine that the termination condition is satisfied. In some embodiments, the processing device 120 may reconstruct an intermediate MR image of the subject based on the k-space lines that have been filled in the k-space. The processing device 120 may determine whether the intermediate MR image of the subject satisfies the quality of the MR image. When the intermediate MR image of the subject satisfies the quality of the MR image, the processing device 120 may determine that the termination condition is satisfied. The processing device 120 may further cause the MR scanner and the one or more sensors to terminate data acquisition in response to determining that the termination condition is satisfied.

In some embodiments, the processing device 120 may reconstruct the one or more target MR images of the subject based on the k-space data acquired after all the scan data are screened by the plurality of conditions.

It should be noted that the above description regarding the process 1500 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 1500 may be accomplished with one or more additional operations not described and/or without one or more of the operations discussed above. For example, operations 1501 and 1502 may be combined into a single operation. As another example, one or more other optional operations (e.g., a storing operation) may be added elsewhere in the process 1500. In the storing operation, the processing device 120 may store information and/or data (e.g., the first scan data, the first motion data, the second scan data, the second motion data, the first condition, the second condition, the third condition, etc.) associated with the medical system 100 in a storage device (e.g., the storage device 130) disclosed elsewhere in the present disclosure.

Figure 16:
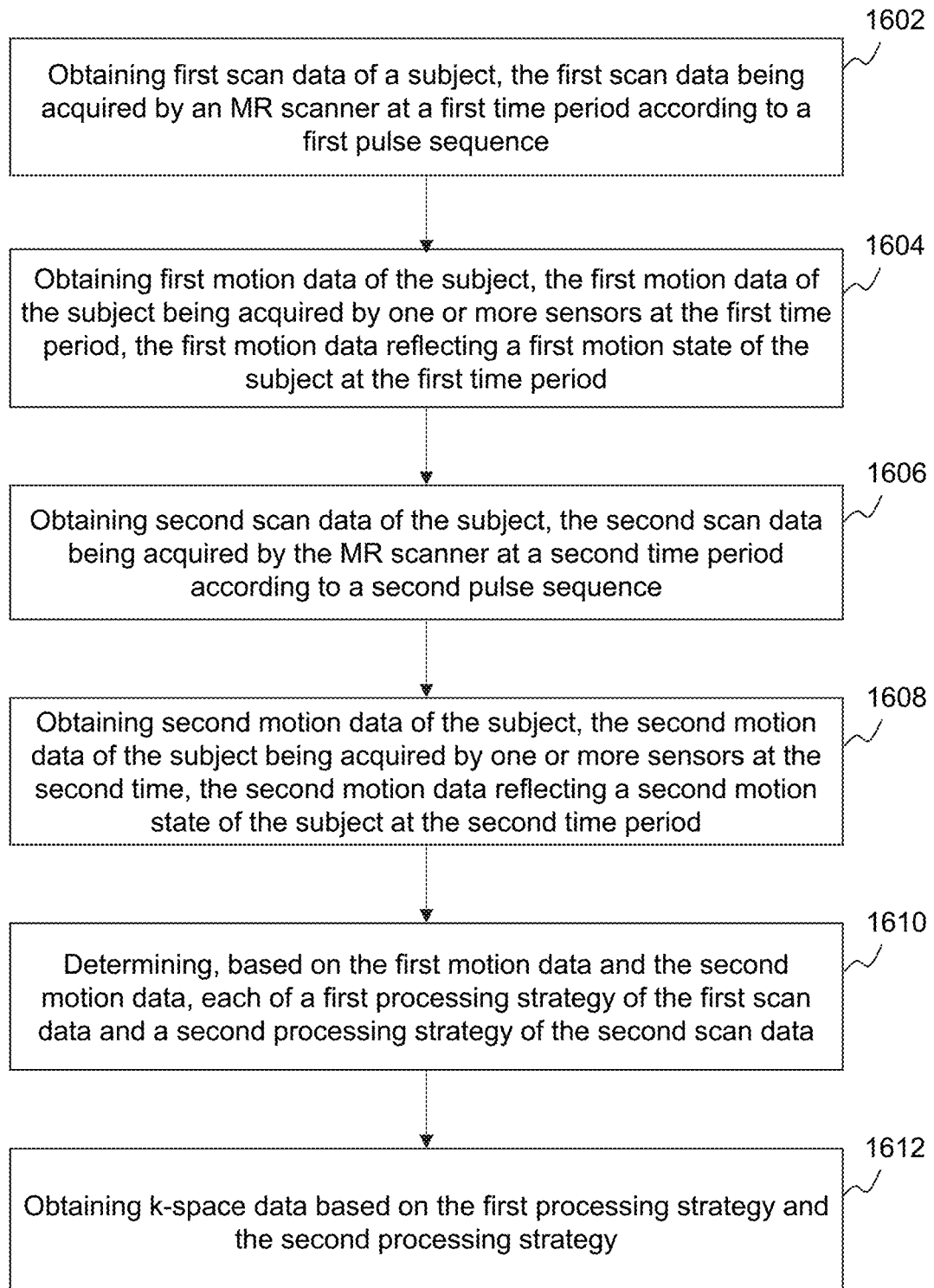
FIG. 16 is a flowchart illustrating an exemplary process for obtaining k-space data according to some embodiments of the present disclosure.

FIG. 16 is a flowchart illustrating an exemplary process for obtaining k-space data according to some embodiments of the present disclosure. In some embodiments, process 1600 may be executed by the medical system 100. For example, the process 1600 may be implemented as a set of instructions (e.g., an application) stored in a storage device (e.g., the storage device 130, the storage device 550). In some embodiments, the processing device 120 (e.g., the processor 540 of the medical imaging system 500 and/or one or more modules illustrated in FIG. 13) may execute the set of instructions and accordingly direct one or more components of the medical system 100 to perform the process 1600.

In 1602, the processing device 120 (e.g., the obtaining module 1310) may obtain first scan data of a subject. The first scan data may be acquired by an MR scanner at a first time period according to a first pulse sequence. In some embodiments, the first scan data may include one or more first MR signals and each of the one or more first MR signals may be generated or acquired at a first time point during the first time period.

The subject may be a patient, a portion of a patient, or any organism that needs to be imaged by an MR scanner (e.g., the MR scanner 110-1). The first time may be a time point or a time period during the scanning of the subject. The first scan data of the subject may be acquired by the MR scanner at the first time according to the first pulse sequence. The first pulse sequence may define one or more phase encoding gradients corresponding to the first time. More descriptions regarding obtaining the first scan data may be found elsewhere in the present disclosure (e.g., operation 1402, operation 1502, and the descriptions thereof).

In 1604, the processing device 120 (e.g., the obtaining module 1310) may obtain first motion data of the subject.

The first motion data of the subject may be acquired by one or more sensors at the first time. The first motion data may reflect a first motion state of the subject at the first time period. In some embodiments, each first MR signal of the first scan data may correspond to a first motion state at a first time point in the second time. As used herein, each first MR signal corresponding to a first motion state refers to that the first motion state is a state of the subject at a first time point in the first time period when the first MR signal is generated and acquired. A first motion state may be defined by one or more motion parameters (e.g., a position, a velocity, a direction, a displacement, a motion acceleration, or the like, or any combination thereof) of the subject at the first time. In some embodiments, the first motion data may be sensor data directly acquired by the one or more sensors at first the time. In some embodiments, the first motion data may be determined based on the sensor data acquired by the one or more sensors at the first time. More descriptions regarding obtaining the first motion data may be found elsewhere in the present disclosure (e.g., operation 1404, operation 1504, and the descriptions thereof).

In 1606, the processing device 120 (e.g., the obtaining module 1310) may obtain second scan data of the subject.

The second scan data may be acquired by the MR scanner during a second time period according to one or more second pulse sequences. In some embodiments, the one or more second pulse sequences may define different phase encoding gradients. The one or more second pulse sequences may be arranged in an MR sequence corresponding to the second times and different from the first pulse sequence included in the MR sequence corresponding to the first time. For example, the second pulse sequences may be pulse sequences next to the first pulse sequence in the MR sequence. The acquisition of the second scan data may be the same or similar to the acquisition of the first scan data.

In some embodiments, the second scan data may include multiple second MR signals acquired at different second time points during the second time period. The count of the multiple second MR signals may exceed 2. The multiple second MR signals may be generated and acquired consecutively. More descriptions regarding the second scan data may be found elsewhere in the present disclosure (e.g., operation 1402, operation 1502, and the descriptions thereof).

In 1608, the processing device 120 (e.g., the obtaining module 1310) may obtain second motion data of the subject.

The second motion data may be acquired by the one or more sensors during the second time period. The second motion data may reflect multiple second motion states of the subject at multiple second time points during the second time period. In some embodiments, each second MR signal of the second scan data may correspond to a second motion state at a second time point in the second time. As used herein, each second MR signal corresponding to a second motion state refers to that the second motion state is a state of the subject at a second time point in the second time period when the second MR signal is generated and acquired. The acquisition of the second motion data of the subject may be the same as the acquisition of the motion data (e.g., the first motion data) of the subject as described in 1604. More descriptions regarding obtaining the second motion data may be found elsewhere in the present disclosure (e.g., operation 1404, operation 1504, and the descriptions thereof).

In 1610, the processing device 120 (e.g., the determination module 1320) may determine, based on the first motion data and the second motion data, each of a first processing strategy of the first scan data and a second processing strategy of the second scan data.

In some embodiments, for each first motion state at a first time point, the processing device 120 may determine whether a difference between the first motion state and each of the second motion states in the second time period satisfies a condition. The condition may include that the difference between the first motion state and the second motion state is larger than a threshold. In some embodiments, the difference between the first motion state at the first time point and the second motion state at the second time point in the second time period may include a variation of each of the one or more motion parameters of the subject at the second time point in the second time period relative to the first time point. In some embodiments, the difference between the first motion state and the second motion state may include that a variation of a weighted sum of the one or more motion parameters of the subject at the second time point in the second time period relative to the first time point. In some embodiments, the motion state of the subject may be denoted as a motion vector that includes the one or more motion parameters. The difference between the first motion state and the second motion state may include a difference of the motion vectors at the second time point and the first time point. The threshold may be a value indicating that the difference between the first motion state and the second motion state has a certain degree of effect on the acquired scan data and the second motion state in the second time period cannot change into the first motion state or close to the first motion state. In some embodiments, the threshold may be provided by a user of the medical system 100. Additionally or alternatively, the threshold may be generated automatically, for example, according to the default setting of the MR scanner, the spatial resolution of the one or more sensors, etc., or any combination thereof.

Figure 18C:
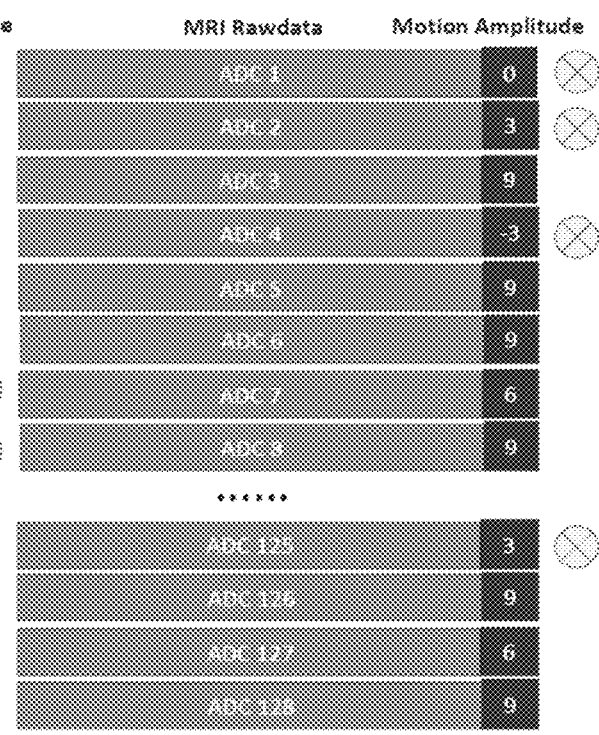
FIG. 18C is a schematic diagram illustrating exemplary processing strategies for scan data according to some embodiments of the present disclosure.

In some embodiments, in response to determining that the difference between the first motion state and each second motion state corresponding to each of the second time points satisfies the condition, the processing device 120 may determine the first processing strategy for the first scan data (e.g., the first MR signal corresponding to the first motion state) including removing the first scan data and determine the second processing strategy for the second scan data including retaining the second scan data, correcting the second scan data, or replacing the second scan data. For example, the second processing strategy for each MR signal in the second scan data may include retaining the MR signal, correcting the MR signal, or replacing the MR signal, etc. As a further example, if a subject turns over and keeps the posture after the subject turns over or moves under the posture during an MR scan, the processing device 120 may determine that the difference between the first motion state and the second motion state satisfies the condition. The processing device 120 may further determine the first processing strategy including removing the scan data acquired by the MR scanner before the subject turns over and determine the second processing strategy including retaining the scan data acquired by the MR scanner after the subject turns over. Referring to FIG. 18C, FIG. 18C is a schematic diagram illustrating exemplary processing strategies according to some embodiments of the present disclosure. The motion amplitudes of the subject at second time points when MR signals ADC 5, ADC 6, ADC 7, ADC 8 are acquired are respectively 9, 9, 6, 9 relative a first time point when an MR signal ADC 1 is acquired. A difference between the motion amplitude at time when the MR signal ADC 1 is acquired and each of the motion amplitudes of the subject at the consecutive second time points when ADC 5, ADC 6, ADC 7, ADC 8 are acquired exceeds 6. A difference between the motion amplitude at time when the MR signal ADC 2 is acquired and each of the motion amplitudes of the subject at the consecutive second time points, when ADC 5, ADC 6, ADC 7, ADC 8 are acquired, exceeds 6. A difference between the motion amplitude at time when the MR signal ADC 4 is acquired and each of the motion amplitudes of the subject at the consecutive second time points, when ADC 5, ADC 6, ADC 7, ADC 8 are acquired, exceeds 6. A difference between the motion amplitude at a time when the MR signal ADC 125 is acquired and each of the motion amplitudes of the subject at the consecutive second time points, when ADC 5, ADC 6, ADC 7, ADC 8 are acquired, exceeds 6. The first processing strategy including removing the scan data of ADC 1, ADC 2, ADC 4, ADC 125 may be determined. The second processing strategy including retaining the scan data of the other data (e.g., ADC 5, ADC 6, ADC 7, ADC 8, etc.) may be determined.

In some embodiments, in response to determining that the difference between the first motion state and each second motion states corresponding to each of the second time points does not the condition, the processing device 120 may determine, based on the first motion data of the subject, the first processing strategy associated with whether using the first scan data to fill one or more k-space lines corresponding to the first pulse sequence in a k-space and determine, based on the second motion data of the subject, the second processing strategy associated with whether using the second scan data to fill one or more k-space lines corresponding to the second pulse sequence in the k-space.

In some embodiments, the difference between the first motion state and the second motion state not satisfying the condition may include a variation of each of the one or more motion parameters of the subject at the second time point relative to the first time point, or a variation of a weighted sum of the one or more motion parameters of the subject at the second time point relative to the first time point, or a difference of the motion vectors at the second time point and the first time point is less than or equal to the threshold. For example, if a subject nods once during an MR scan, the processing device 120 may determine that the difference between the first motion state and the second motion state does not satisfy the condition. The processing device 120 may further determine, based on the first motion data of the head when the subject nods, the first processing strategy associated with whether using the first scan data to fill one or more k-space lines corresponding to the first pulse sequence in a k-space and determine, based on the second motion data before or after the subject nods, the second processing strategy associated with whether using the second scan data acquired before or after the subject nods to fill one or more k-space lines corresponding to the second pulse sequence in the k-space.

In some embodiments, in response to determining that the difference between the first motion state and each second motion states corresponding to each of the second time points does not the condition, the processing device 120 may determine the first processing strategy for the first scan data (e.g., the first MR signal corresponding to the first motion state) including retaining the first scan data, correcting the first scan data, or replacing the first scan data and determine the second processing strategy for the second scan data including retaining the second scan data, correcting the second scan data, or replacing the second scan data. For example, the second processing strategy for each MR signal in the second scan data may include retaining the second scan data, correcting the second scan data, or replacing the second scan data, etc. More descriptions for retaining scan data, correcting scan data, or replacing scan data may be found elsewhere in the present disclosure.

In 1612, the processing device 120 (e.g., the obtaining module 1310) may obtain k-space data based on the first processing strategy and the second processing strategy. More descriptions for determining the k-space data based on the first processing strategy and the second processing strategy may be found elsewhere in the present disclosure (e.g., FIGS. 14-15 and the descriptions thereof).

It should be noted that the above description regarding the process 1600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 1600 may be accomplished with one or more additional operations not described and/or without one or more of the operations discussed above. For example, operations 1602 and 1604 may be combined into a single operation. As another example, one or more other optional operations (e.g., a storing operation) may be added elsewhere in the process 1600. In the storing operation, the processing device 120 may store information and/or data (e.g., the first scan data, the first motion data, the second scan data, the second motion data, the condition, the first processing strategy, the second processing strategy, etc.) associated with the medical system 100 in a storage device (e.g., the storage device 130) disclosed elsewhere in the present disclosure.

Figure 17:
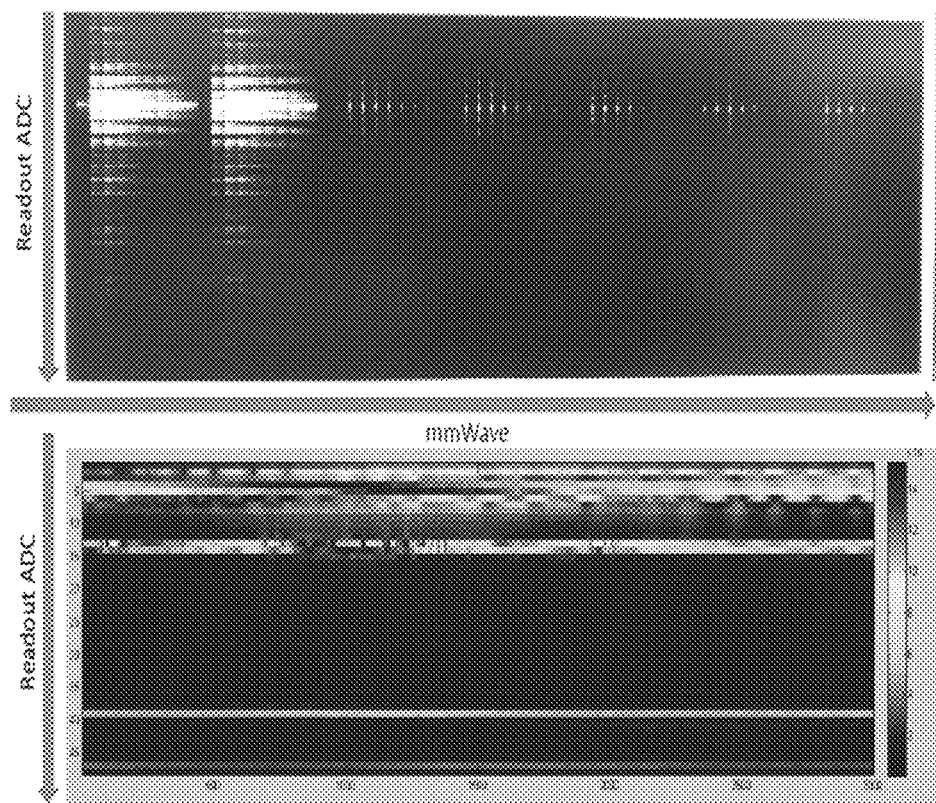
FIG. 17 is a schematic diagram illustrating exemplary MR echo signals and radio echo signals and according to some embodiments of the present disclosure.

FIG. 17 is a schematic diagram illustrating exemplary MR signals and radar signals and according to some embodiments of the present disclosure. As shown in FIG. 17, the upper portion is an image of MR signals (i.e., MR echo signals) as time, and the lower portion is an image of radar signals (i.e., radar echo signals) as the time. At the same time, an MR signal may correspond to a radar signal. That is, scan data of a subject and motion data of the subject may be acquired simultaneously.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by the present disclosure, and are within the spirit and scope of the exemplary embodiments of the present disclosure.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

What is claimed is:

1. A system for magnetic resonance imaging (MRI), comprising:
    at least one storage device including a set of instructions; and
    at least one processor configured to communicate with the at least one storage device, wherein when executing the set of instructions, the at least one processor is configured to direct the system to perform operations including:
        obtaining scan data of a subject, the scan data being acquired by an MR scanner at a time according to a pulse sequence;
        obtaining motion data of the subject, the motion data of the subject being acquired by one or more sensors at the time, the motion data reflecting a motion state of the subject at the time;
        determining, based on the motion data of the subject, a processing strategy indicating whether using the scan data to fill one or more k-space lines corresponding to the pulse sequence in a k-space, including:
            determining whether the motion state satisfies a first condition;
            in response to determining that the motion state does not satisfy the first condition,
                obtaining second scan data of the subject, the second scan data being acquired by the MR scanner at next time according to the pulse sequence; and
                determining the processing strategy including replacing the scan data using the second scan data to fill the one or more k-space lines corresponding to the pulse sequence; and
        obtaining k-space data based on the processing strategy.

2. A system for magnetic resonance imaging (MRI), comprising:
    at least one storage device including a set of instructions; and
    at least one processor configured to communicate with the at least one storage device, wherein when executing the set of instructions, the at least one processor is configured to direct the system to perform operations including:
        obtaining first scan data of a subject, the first scan data being acquired by an MR scanner at a first time according to a first pulse sequence;
        obtaining first motion data of the subject, the first motion data of the subject being acquired by one or more sensors at the first time, the first motion data reflecting a first motion state of the subject at the first time;

determining, based on the first motion data, whether the first motion state satisfies a first condition; and determining k-space data based on whether the first motion state satisfies the first condition, including:
- in response to determining that the first motion state satisfies the first condition, determining, based on the first scan data, the k-space data; or
- in response to determining that the first motion state does not satisfy the first condition,
  - obtaining second scan data of the subject, the second scan data being acquired by the MR scanner at a second time according to a second pulse sequence;
  - obtaining second motion data of the subject, the second motion data being acquired by the one or more sensors at the second time according to the second pulse sequence, the second motion data reflecting a second motion state of the subject at the second time; and
  - determining the k-space data based on the second scan data and the second motion data, wherein the second pulse sequence is determined by:
    - determining whether the first scan data satisfies a third condition, the third condition indicating a contribution of one or more k-space lines corresponding to the first pulse sequence in a k-space; and
    - determining the second pulse sequence based on whether the first scan data satisfies the third condition, including:
      - in response to determining that the first scan data satisfies the third condition, designating the first pulse sequence as the second pulse sequence.

3. A system for magnetic resonance imaging (MRI), comprising:
at least one storage device including a set of instructions; and
at least one processor configured to communicate with the at least one storage device, wherein when executing the set of instructions, the at least one processor is configured to direct the system to perform operations including:
- obtaining first scan data of a subject, the first scan data being acquired by an MR scanner at a first time period according to a first pulse sequence;
- obtaining first motion data of the subject, the first motion data of the subject being acquired by one or more sensors at the first time, the first motion data reflecting a first motion state of the subject at the first time;
- obtaining second scan data of the subject, the second scan data being acquired by the MR scanner at a second time period according to a second pulse sequence;
- obtaining second motion data of the subject, the second motion data of the subject being acquired by one or more sensors at the second time, the second motion data reflecting a second motion state of the subject at the second time;
- determining, based on the first motion data and the second motion data, each of a first processing strategy of the first scan data and a second processing strategy of the second scan data, wherein the second pulse sequence is determined by:
  - determining whether the first scan data satisfies a third condition, the third condition indicating a contribution of one or more k-space lines corresponding to the first pulse sequence in a k-space; and
  - determining the second pulse sequence based on whether the first scan data satisfies the third condition, including:
    - in response to determining that the first scan data satisfies the third condition, designating the first pulse sequence as the second pulse sequence; and
  - obtaining k-space data based on the first processing strategy and the second processing strategy.

4. The system of claim 1, wherein the motion data is acquired by the radar sensor with an emission frequency in a range from 1 GHz and 100 GHz configured to distinguish the subject from other objects around the subject.

5. The system of claim 1, wherein the determining, based on the motion data of the subject, a processing strategy includes:
in response to determining, based on the motion data, that the motion state of the subject satisfies the first condition and does not satisfy a second condition, determining the processing strategy including correcting the scan data based on the motion data to obtain corrected scan data for filling the one or more k-space lines corresponding to the pulse sequence.

6. The system of claim 1, wherein the determining, based on the motion data of the subject, a processing strategy includes:
in response to determining, based on the motion data, that the motion state of the subject satisfies a second condition, determining the processing strategy including retaining the scan data for filling the one or more k-space lines corresponding to the pulse sequence.

7. The system of claim 1, wherein the obtaining second scan data of the subject includes:
in response to determining, based on the motion data, that the motion state of the subject does not satisfy the first condition and the scan data satisfies a third condition, obtaining the second scan data of the subject.

8. The system of claim 1, wherein the determining, based on the motion data of the subject, a processing strategy includes:
in response to determining, based on the motion data, that the motion state of the subject does not satisfy the first condition and the scan data does not satisfy the third condition, determining the processing strategy including removing the scan data.

9. The system of claim 2, wherein the first motion data indicates one or more motion parameters associated with the first motion state, and the determining, based on the first motion data, whether the first motion state satisfies a first condition includes:
performing a weighted summation on values of the one or more motion parameters to obtain a weighted result; and
determining, based on the weighted result, whether the first motion state satisfies the first condition.

10. The system of claim 2, wherein determining, based on the first scan data, the k-space data includes:
determining, based on the first scan data and whether the first motion state satisfies a second condition associated with whether the first scan data needs to be corrected, the k-space data.

11. The system of claim 10, wherein the determining, based on the first scan data and whether the first motion state satisfies a second condition, the k-space data includes:

in response to determining that the first motion state satisfies the second condition, determining the k-space data by filling the one or more k-space lines in the k-space using the first scan data, the one or more k-space lines corresponding to the first pulse sequence.

12. The system of claim 10, wherein the determining, based on the first scan data and whether the first motion state satisfies a second condition, the k-space data includes:
   in response to determining that the first motion state does not satisfy the second condition,
      obtaining corrected first scan data by correcting the first scan data based on the first motion data; and
      determining the k-space data by filling the one or more k-space lines in the k-space using the corrected first scan data, the one or more k-space lines corresponding to the first pulse sequence.

13. The system of claim 2, wherein the determining the k-space data based on the second scan data and the second motion data includes:
   determining, based on the second motion data, that the second motion state satisfies the first condition; and
   determining the k-space data by filling the one or more k-space lines corresponding to the first pulse sequence in the k-space based on the second scan data.

14. The system of claim 2, wherein the determining the second pulse sequence based on whether the first scan data satisfies the third condition includes:
   in response to determining that the first scan data does not satisfy the third condition, obtaining the second pulse sequence different from the first pulse sequence.

15. The system of claim 14, wherein the determining the k-space data based on the second scan data and the second motion data includes:
   determining that the second motion state satisfies the first condition, determining the k-space data by filling one or more k-space lines corresponding to the second pulse sequence in the k-space based on the second scan data.

16. The system of claim 3, wherein the determining, based on the first motion data and the second motion data, each of a first processing strategy of the first scan data and a second processing strategy of the second scan data includes:
   in response to determining that a difference between the first motion state and the second motion state satisfies a condition,
      determining the first processing strategy including removing the first scan data; and
      determining the second processing strategy including retaining the second scan data.

17. The system of claim 3, wherein the determining, based on the first motion data and the second motion data, each of a first processing strategy of the first scan data and a second processing strategy of the second scan data includes:
   in response to determining that a difference between the first motion state and the second motion state does not a condition,
      determining, based on the first motion data of the subject, the first processing strategy associated with whether using the first scan data to fill one or more k-space lines corresponding to the first pulse sequence in a k-space; and
      determining, based on the second motion data of the subject, the second processing strategy associated with whether using the second scan data to fill one or more k-space lines corresponding to the second pulse sequence in the k-space.

\* \* \* \* \*